US009627199B2

(12) United States Patent
Motayed et al.

(10) Patent No.: US 9,627,199 B2
(45) Date of Patent: Apr. 18, 2017

(54) METHODS OF FABRICATING MICRO- AND NANOSTRUCTURE ARRAYS AND STRUCTURES FORMED THEREFROM

(71) Applicants: University of Maryland, College Park, College Park, MD (US); Northrop Grumman Systems Corporation, Falls Church, VA (US); The United States of America, as Represented by the Secretary of Commerce, Washington, DC (US)

(72) Inventors: Abhishek Motayed, Rockville, MD (US); Sergiy Krylyuk, Gaithersburg, MD (US); Albert V. Davydov, North Potomac, MD (US); Matthew King, Linthicum, MD (US); Jong-Yoon Ha, Gaithersburg, MD (US)

(73) Assignees: University of Maryland, College Park, College Park, MD (US); Northrop Grumman Systems Corporation, Falls Church, VA (US); The United States of America, as represented by the Secretary of Commerce, National Institute of Standards and Technology, Washington, DC (US)

( * ) Notice: Subject to any disclaimer, the term of this patent is extended or adjusted under 35 U.S.C. 154(b) by 0 days.

(21) Appl. No.: 14/568,576

(22) Filed: Dec. 12, 2014

(65) Prior Publication Data
US 2015/0170901 A1 Jun. 18, 2015

Related U.S. Application Data

(60) Provisional application No. 61/915,877, filed on Dec. 13, 2013.

(51) Int. Cl.
*H01L 21/02* (2006.01)
*H01L 33/00* (2010.01)
(Continued)

(52) U.S. Cl.
CPC .... *H01L 21/0259* (2013.01); *H01L 21/02433* (2013.01); *H01L 33/007* (2013.01);
(Continued)

(58) Field of Classification Search
CPC .................................................. H01L 21/0259
See application file for complete search history.

(56) References Cited

U.S. PATENT DOCUMENTS

2006/0252235 A1* 11/2006 Aberle ................ H01L 21/2022
438/478
2011/0263111 A1* 10/2011 Melnik .................... C23C 16/30
438/569
(Continued)

OTHER PUBLICATIONS

Aluri, G.S. et al. (2011) "*Highly Selective GaN-nanowire/TiO2-nanocluster Hybrid Sensors for Detection of Benzene and Related Environment Pollutants*," Nanotechnology 22:295503.
(Continued)

*Primary Examiner* — Yu-Hsi D Sun
(74) *Attorney, Agent, or Firm* — William C. Schrot; AuerbachSchrot LLC

(57) ABSTRACT

Methods of fabricating micro- and nanostructures comprise top-down etching of lithographically patterned GaN layer to form an array of micro- or nanopillar structures, followed by selective growth of GaN shells over the pillar structures via selective epitaxy. Also provided are methods of forming micro- and nanodisk structures and microstructures formed from thereby.

18 Claims, 25 Drawing Sheets

(51) Int. Cl.
    H01L 21/306     (2006.01)
    H01L 21/3065    (2006.01)
    H01L 33/18      (2010.01)
    H01L 33/32      (2010.01)
(52) U.S. Cl.
    CPC ...... H01L 21/0237 (2013.01); H01L 21/0254
         (2013.01); H01L 21/0257 (2013.01); H01L
         21/0262 (2013.01); H01L 21/02381 (2013.01);
         H01L 21/02458 (2013.01); H01L 21/02639
         (2013.01); H01L 21/3065 (2013.01); H01L
              21/30612 (2013.01); H01L 21/30617
         (2013.01); H01L 21/30621 (2013.01); H01L
              33/18 (2013.01); H01L 33/32 (2013.01)

(56)            References Cited

U.S. PATENT DOCUMENTS

| | | | | |
|---|---|---|---|---|
| 2011/0309233 | A1* | 12/2011 | Seo | B82Y 20/00 250/208.1 |
| 2013/0026480 | A1* | 1/2013 | Fenwick | H01L 21/02381 257/76 |
| 2014/0264260 | A1* | 9/2014 | Chang | H01L 33/005 257/13 |

OTHER PUBLICATIONS

Bergbauer, W. et al. (2010) "Continuous-flux MOVPE growth of position-controlled N-face GaN Nanorods and Embedded InGaN Quantum Wells," Nanotechnology 21:305201.
Bertness, K.A. et al. (2010) "Controlled Nucleation of GaN Nanowires Grown with Molecular Beam Epitaxy," Adv. Fund. Mater. 20:2911.
Chelda-Gourmala, O. et al. (2010) "Complete HVPE Experimental Investigations: Cartography of SAG GaN Towards Quasi-substrates or Nanostructures," J. Cryst. Growth 312:1899-1907.
Chen, L. et al. (2008) "Inductively Coupled Plasma Etching of AlGaN Using C12/Ar/BCl3 Gases," Proc. SPIE 6621:66211A.
Choi, H.W. et al. (2006) "Lasing in GaN Microdisks Pivoted on Si," Appl. Phys. Lett. 89:211101.
Chung, K. et al. (2010) "Transferrable GaN Layers Grown on ZnO-Coated Graphene Layers for Optoelectronic Devices," Science 330:655.
Craven, M.D. et al. (2002) "Threading Dislocation Reduction via Laterally Overgrown Nonpolar (1120) α-plane GaN," Appl. Phys. Lett. 81:1201.
Davydov, V.Y. et al. (1998) "Phonon Dispersion and Raman Scattering in Hexagonal GaN and AlN," Phys. Rev. B 58:12899.
Debnath, R. et al. (2014) "Top-down Fabrication of Large-area GaN Micro- and Nanonpillars," J. Vac. Sci. Technol. B 32:021204.
Demangeot, F. et al. (2002) "Optical Investigation of Micrometer and Nanometer-size Individual GaN Pillars Fabricated by Reactive Ion Etching," J. Appl. Phys. 91:6520.
Demchenko, D.O. et al. (2013) "Yellow Luminescence of Gallium Nitride Generated by Carbon Defect Complexes," Phys. Rev. Lett. 110:087404.
Du, D. et al. (2005) "Systematic Prediction of Kinetically Limited Crystal Growth Morphologies," Phys. Rev. Lett. 95:155503.
Fasol, G. (1996) "Room-Temperature Blue Gallium Nitride Laser Diode," Science 272:1751.
Fichtenbaum, N.A. et al. (2007) "Metalorganic Chemical Vapor Deposition Regrowth of InGaN and GaN on N-polar Pillar and Stripe Nanostructures," Jpn. J. Appl. Phys., Part 2 46:L230.
Gibart, P. (2004) "Metal Organic Vapour Phase Epitaxy of GaN and Lateral Overgrowth," Rep. Prog. Phys. 67:667.
Gradečak, S. et al. (2004) "Bending of Dislocations in GaN During Epitaxial Lateral Overgrowth," Appl. Phys. Lett. 85:4648.
Harima, H. (2002) "Properties of GaN and Related Compounds Studied by Means of Raman Scattering," J. Phys.: Condens. Matter 14:R967.

Hersee, S.D. et al. (2006) "The Controlled Growth of GaN Nanowires," Nano Lett. 6:1808-11.
Hong, Y.J. et al. (2011) "Visible-Color-Tunable Light-Emitting Diodes," Adv. Mater. 23:3284.
Ide, T. et al. (2001) "Advantages of AlN/GaN Metal Insulator Semiconductor Field Effect Transistor Using Wet Chemical Etching with Hot Phosphoric Acid," Jpn. J. Appl. Phys., Part 1 40:4785.
Johnson, J.C. et al. (2002) "Single Gallium Nitride Nanowire Lasers," Nature Mater. 1:106-110.
Kaneko, Y. et al. (1997) "Melt-back Etching of GaN," Solid-State Electron. 41:295-298.
Krylyuk, S. et al. (2012) "Large-area GaN n-core/p-shell Arrays Fabricated Using Top-down Etching and Selective Epitaxial Overgrowth," Appl. Phys. Lett. 101:241119.
Le Boulbar, E.D. et al. (2013) "Facet Recovery and Light Emission from GaN/InGaB/GaB core-shell Structures Grown by Metal Organic Vapour Phase Epitaxy on Etched GaN Nanorod arrays," Appl. Phys. 114:094302.
Li, S. & Waag, A. (2012) "GaN Based Nanorods for Solid State Lighting," J. Appl. Phys. 111:071101.
Liu, H.-P. et al. (2004) "The Growth Mechanism of GaN Grown by Hydride Vapor Phase Epitaxy in $N_2$ and $H_2$ Carrier Gas," J. Cryst. Growth 260:79.
Lundskog, A. et al. (2012) "Morphology Control of Hot-Wall MOCVD Selective Area Grown Hexagoal GaN Pyramids," Cryst. Growth Des. 12:5491-5496.
Matsubara, H. et al. (2008) "GaN Photonic-Crystal Surface-Emitting Laser at Blue-Violet Wavelengths," Science 319:445-447.
Mitchell, C.C. et al. (2001) "Mass Transport in the Epitaxial Lateral Overgrowth of Gallium Nitride," J. Cryst. Growth 222:144-153.
Morkoc, H. & Mohammad, S.N. (1995) "High-Luminosity Blue and Blue-Green Gallium Nitride Light-Emitting Diodes," Science 267:51-55.
Naureen, S. et al. (2011) "High Optical Quality InP-based Nanopillars Fabricated by a Top-down Approach," Nano Lett. 11:4805-4811.
Naureen, S. et al. (2012) "Top-Down Fabrication of High Quality III-V Nanostructures by Monolayer Controlled Sculpting and Simultaneous Passivation," Adv. Funct. Mater. 23:1620-1627.
Naureen, S. et al. (2013) "Generation of Substrate-free III-V Nanodisks from User-defined Multilayer Nanopillar Arrays for Integration on Si," Nanotechnology 24:225301.
Paramanik, D. et al. (2012) "Formation of Large-area GaN Nanostructures with Controlled Geometry and Morphology Using Top-down Fabrication Scheme," J. Vac. Sci. Technol. B 30:052202.
Qian, F. et al. (2005) "Core/Multishell Nanowire Heterostructures as Multicolor, High-Efficiency Light-Emitting Diodes," Nano Lett. 5:2287-2291.
Qian, F. et al. (2008) "Multi-quantum-well Nanowire Heterostructures for Wavelength-controlled Lasers," Nature Mater. 7:701-706.
Reshchikov, M.A. & Morkoc, H. (2005) "Fabrication and Evaluation of GaN Negative and Bifocal Microlenses," J. Appl. Phys. 97:061301.
Sanatinia, R. et al. (2012) "Surface Second-Harmonic Generation from Vertical CaP Nanopillars," Nano Lett. 12:820.
Sanatinia, R. et al. (2012) "GaAs Nanopillar Arrays with Suppressed Broadband Reflectance and High Optical Quality for Photovoltaic Applications," Opt. Mater. Express 2:1671-1679.
Sanders, A. et al. (2011) "Homoepitaxial n-core: p-shell Gallium Nitride Nanowires: HVPE Overgrowth on MBE Nanowires," Nanotechnology 22:465703.
Schubert, E.F. et al. (1997) "Optical Properties of Si-doped GaN," Appl. Phys. Lett. 71:921.
Shul, R.J. et al. (1998) "Selective Inductively Coupled Plasma Etching of Group-III Nitrides in $Cl_2$- and $BCl_3$ _based Plasmas," J. Vac. Sci. Technol. A 16:1621.
Smith, M. et al. (1996) "Mechanisms of Band-edge Emission in Mg-doped p-type GaN," Appl. Phys. Lett. 68:1883.
Stocker, D.A. et al. (1998) "Crystallographic Wet Chemical Etching of GaN," Appl. Phys. Lett. 73:2654.
Tamboli, A.C. et al. (2007) "Room-temperature Continuous-wave Lasing in GaN/InGaN Microdisks," Nature Photon. 1:61.

(56) References Cited

OTHER PUBLICATIONS

Tanaka, S. et al. (2000) "*Defect Structure in Selective Area Growth GaN Pyramid on (111) Si Substrate*," Appl. Phys. Lett. 76:2701.

Thillosen, N. et al. (2006) "*The State of Strain in Single GaN Nanocolumns As Derived from Micro-Photoluminescence Measurements*," Nano Lett. 6:704-708.

Tung, L.T. et al. (2009) "*Photoluminescence and Raman Studies of GaN Films Grown by MOCVD*," J. Phy.: Conf. Ser. 187:012021.

Vicknesh, S. et al. (2007) "*Fabrication of Deeply Undercut GaN-based Microdisk Structure on Silicon Platforms*," Appl. Phys. Lett. 90:071906.

Waag, A. et al. (2011) "*The Nanorod Approach: GaN NanoLEDs for Solid State Lighting*," Phys. Status Solidi C 8:2296.

Waltereit, P. et al. (2000) "*Nitride Semiconductors Free of Electrostatic Fields for Efficient White Light-emitting Diodes*," Nature 406:865.

Wang, G.T. et al. (2011) "*Nanowires: Lighting the future*," SPIE Newsroom DOI:10.1117/2.1201106.003796:1-3.

Wang, Y.D. et al. (2005) "*High Optical Quality GaN Nanopillar Arrays*," Appl. Phys. Lett. 86:071917.

Yablonskii, G.P. et al. (2002) "*Luminescence and Stimulated Emission from GaN on Silicon Substrates Heterostructures*," Phys. Status Solidi A 192:54.

Yan, R. et al. (2009) "*Nanowire Photonics*," Nature Photon. 3:569.

Zhao, D.G. et al. (2003) "*Stress and Its Effect on Optical Properties of GaN Epilayers Grown on Si (111), 6H-SiC (0001), and c-plane Sapphire*," Appl. Phys. Lett. 83:677.

Zheleva, T.S. et al. (1999) "*Pendeo-epitaxy: A New Approach for Lateral Growth of Gallium Nitride Films*," J. Electron. Mater. 28:L5-L8.

Zhuang, D. & Edgar, J.H. (2005)"*Wet Etching of GaN, AlN, and SiC: A Review*," Mater. Sci. Eng. R 48:1-46.

\* cited by examiner

METHODS OF FABRICATING MICRO- AND NANOSTRUCTURE ARRAYS AND STRUCTURES FORMED THEREFROM

CROSS-REFERENCE TO RELATED APPLICATIONS

This application is based on U.S. Provisional Patent Application Ser. No. 61/915,877, entitled "Large-area GaN n-core/p-shell arrays fabricated using top-down etching and selective epitaxial overgrowth," and filed Dec. 13, 2013, which application is incorporated herein by reference in its entirety and to which priority is claimed.

STATEMENT REGARDING FEDERALLY SPONSORED RESEARCH OR DEVELOPMENT

This work was supported by the Defense Threat Reduction Agency under Research Award No. HDTRA11010107 and is jointly owned by the National Institute of Standards and Technology. The US government has certain rights in this invention.

FIELD OF THE INVENTION

The present invention relates to methods of fabricating micro- and nanostructures, and in particular methods for forming an array of core-shell micro- or nanostructures and the resulting fabricated micro- and nanostructure arrays.

BACKGROUND OF THE INVENTION

Three-dimensional gallium nitride (GaN) micro- and nanostructures have the potential to boost the performance of GaN-based electronic and optoelectronic devices (Chung, K. et al. (2010) "*Transferrable GaN Layers Grown on ZnO-Coated Graphene Layers for Optoelectronic Devices,*" Science 330:655; Matsubara, H. et al. (2008) "*GaN Photonic-Crystal Surface-Emitting Laser at Blue-Violet Wavelengths,*" Science 319:445-447; Fasol, G. (1996) "*Room-Temperature Blue Gallium Nitride Laser Diode,*" Science 272:1751; Morkoc, H. & Mohammad, S. N. (1995) Science 267:51). These structures have significant benefits including large active surface area, enhanced light extraction efficiency, greater carrier confinement, lower defect density, and reduction of detrimental spontaneous polarization effects as compared to conventional planar thin-film devices. The latter benefit arises as p-n junctions can be realized on non-polar and semi-polar surfaces.

GaN-based micro- and nanopillar (NP) core-shell structures have been produced by a number of different techniques including: (1) catalyst-assisted metal-organic vapor phase epitaxy (MOVPE) (Qian, F. et al. (2005) "*Core/Multishell Nanowire Heterostructures as Multicolor, High-Efficiency Light-Emitting Diodes,*" Nano Lett. 5:2287-2291), (2) selective area epitaxy (SAE) of nanorods using MOVPE through a dielectric mask and subsequent conformal shell growth (Hong, Y. J. et al. (2011) "*Visible-Color-Tunable Light-Emitting Diodes,*" Adv. Mater. 23:3284; Waag, A. et al. (2011) "*The Nanorod Approach: GaN NanoLEDs for Solid State Lighting,*" Phys. Status Solidi C 8:2296), and (3) a combination of molecular beam epitaxy (MBE) grown n-type GaN nanowires and Hydride Vapor Phase Epitaxy (HVPE) grown p-GaN conformal shells (Sanders, A. et al. (2011) "*Homoepitaxial n-core: p-shell Gallium Nitride Nanowires: HVPE Overgrowth on MBE Nanowires,*" Nanotechnology 22:465703). Despite superior material quality in structures fabricated from such methods, lack of large-area control of dimensions, morphology, and orientation remain problematic for device applications.

In producing NP arrays for device applications, the structures and/or growth-techniques should possess the following characteristics: high-aspect ratio, large-area uniformity in dimensions and orientation, scalable fabrication and growth methods, and precise control of shell morphology, microstructure, and dopant concentration. Development of NP arrays with high aspect ratios (10 and higher) and diameters in the range of 150 nm to 250 nm require particularly careful design of the etch process and selection of the mask material. It is also important to analyze and control the surface defects as well as strain in the fabricated NP arrays. Obtaining smooth and defect-free sidewalls is also important for the subsequent selective epitaxial overgrowth.

Traditionally, research on nitride nanostructures focused on bottom-up fabrication methods (Qian, F. et al. (2008) "*Multi-quantum-well Nanowire Heterostructures for Wavelength-controlled Lasers,*" Nature Mater. 7:701-0706; Yan, R. et al. (2009) "*Nanowire Photonics,*" Nature Photon. 3:569; Johnson, J. C. et al. (2002) "*Single Gallium Nitride Nanowire Lasers,*" Nature Mater. 1:106-110; Qian, F. et al. (2005), supra, Nano Lett. 5:2287; Aluri, G. S. et al. (2011) "*Highly Selective GaN-nanowire/TiO2-nanocluster Hybrid Sensors for Detection of Benzene and Related Environment Pollutants,*" Nanotechnology 22:295503). Top-down fabrication methods provided an alternative route for producing micro- and nanopillar (NP) arrays from epitaxially grown thin films (Naureen, S. et al. (2011) "*High Optical Quality InP-based Nanopillars Fabricated by a Top-down Approach,*" Nano Lett. 11:4805-4811; Naureen, S. et al. (2013) "*Generation of Substrate free III-V Nanodisks from User-defined Multilayer Nanopillar Arrays for Integration on Si,*" Nanotechnology 24:225301; Naureen, S. et al. (2012) "*Top-Down Fabrication of High Quality III-V Nanostructures by Monolayer Controlled Sculpting and Simultaneous Passivation,*" Adv. Funct. Mater. 23:1620-1627; Sanatinia, R. et al. (2012) "*GaAs Nanopillar Arrays with Suppressed Broadband Reflectance and High Optical Quality for Photovoltaic Applications,*" Opt. Mater. Express 2:1671-1679; Sanatinia, R. et al. (2012) "*Surface Second-Harmonic Generation from Vertical GaP Nanopillars,*" Nano Lett. 12:820).

In addition, selective area epitaxy (SAE) techniques used to fabricate nanostructures have significantly advanced in the past few years (Li, S. & Waag, A. (2012) "*GaN Based Nanorods for Solid State Lighting,*" J. Appl. Phys. 111: 071101; Hersee, S. D. et al. (2006) "*The Controlled Growth of GaN Nanowires,*" Nano Lett. 6:1808-1811). GaN columns or rods grown along the c-axis bounded by six $\{1\bar{1}00\}$ m-plane facets are especially attractive because InGaN quantum wells formed on these facets benefit from the absence of polarization fields (Waltereit, P. et al. (2000) "*Nitride Semiconductors Free of Electrostatic Fields for Efficient White Light-emitting Diodes,*" Nature 406:865). Arrays of GaN micro- and nanocolumns have been successfully grown by SAE using metal organic vapor phase epitaxy (MOVPE) and molecular beam epitaxy techniques (Bergbauer, W. et al. (2010) "*Continuous-flux MOVPE growth of position-controlled N-face GaN Nanorods and Embedded InGaN Quantum Wells,*" Nanotechnology 21:305201; Bertness, K. A. et al. (2010) "*Controlled Nucleation of GaN Nanowires Grown with Molecular Beam Epitaxy,*" Adv. Funct. Mater. 20:2911). However, although traditional SAE techniques have achieved the desired dimensional and orientation control, they require highly specific growth conditions leading to non-optimal material quality (Wang, G. T. et al. (2011) "*Nanowires: Lighting the future*" SPIE Newsroom, Jul. 26, 2011, doi:10.1117/2.1201106.003796).

GaN core/shell hexagonal columns have also been realized by inductively coupled plasma (ICP) dry etching of GaN films followed by MOVPE overgrowth to recover the m-plane facets (Fichtenbaum, N. A. et al. (2007) *"Metalorganic Chemical Vapor Deposition Regrowth of InGaN and GaN on N-polar Pillar and Stripe Nanostructures,"* Jpn. J. Appl. Phys., Part 2 46:L230; Le Boulbar, E. D. et al. (2013) *"Facet Recovery and Light Emission from GaN/InGaN/GaN core-shell Structures Grown by Metal Organic Vapour Phase Epitaxy on Etched GaN Nanorod arrays,"* Appl. Phys. 114:094302). The combination of nanopatterning and plasma etching to form GaN pillars and subsequent coaxial shell growth has also been attempted to alleviate the problems associated with SAE (Wang, G. T. et al. (2011), supra, SPIE Newsroom, Jul. 26, 2011; Fichtenbaum, N. A. et al. (2007), supra, Jpn. J. Appl. Phys., Part 2 46:L230).

However, significant challenges and problems associated with such conventional fabrication techniques remain, including control of strain, defect reduction, and mitigation of unwanted polarization fields. Accordingly, there is a need for improved fabrication methods and resulting micro- and nanostructures that overcome some or all of the above-noted limitations and/or disadvantages.

SUMMARY OF THE INVENTION

The present invention relates to large-area, vertically aligned GaN core/shell structures on silicon substrates, and methods of fabricating micro- and nano-pillar structures by inductively coupled plasma etching of lithographically patterned GaN epitaxial layer. According to embodiments, the core diameter ranges from about 250 nm to about 10 μm and with varying or selected pitch (inter-pillar distance). According to some embodiments, GaN shells are formed using selective overgrowth by Hydride Vapor Phase Epitaxy. The shells may form truncated hexagonal pyramids with {1$\bar{1}$01} side-facets or hexagonal prisms with {1$\bar{1}$00} side-facets.

According to an embodiment of the present invention, a method of fabricating an array of microstructures comprises the steps of: providing an epilayer of gallium nitride (GaN) grown on a substrate; etching an array of GaN pillars in the substrate; and growing GaN shells on the etched array of GaN pillars to form core-shell structures via selective epitaxy.

In some embodiments, the substrate comprises sapphire, silicon, gallium arsenide, silicon carbide, or some other type of suitable material known to those of skill in the art. In some implementations, the GaN epilayer has a thickness of between about 1.75 μm and about 0.50 μm. In some implementations, the substrate further comprises a buffer layer intermediate the Si base and the GaN epilayer. In some implementations, the buffer layer comprises at least one of aluminum nitride (AlN) and aluminum gallium nitride (AlGaN). In some implementations, the buffer layer has a thickness of between about 100 nm and about 200 nm.

In some embodiments, the GaN pillars are undoped. In other embodiments, the GaN pillars are doped with, for example, silicon, magnesium, zinc, or iron. In some embodiments, the GaN shells are undoped. In other embodiments, the GaN shells are doped with, for example, silicon, magnesium, zinc, or iron. In some implementations, the shells comprise portions having different doping and/or chemical compositions, e.g., such as $In_xGa_{1-x}N$ and $Al_xGa_{1-x}N$, which may be sequentially grown on the pillars.

In some embodiments, the pillars have a diameter of between about 250 nm to about 10 μm. In some embodiments, the pillars have a pitch of between about 0.5 μm to about 20 μm. In some embodiments, the pillars have a sidewall angle of between about 50° and about 90°.

In some embodiments, the etching step comprises inductively coupled plasma (ICP) etching. In some embodiments, the method includes the additional step of chemically etching the ICP etched array of pillars. The chemical etching step may comprise hot phosphoric acid etching. In some embodiments, the chemical etching step comprises etching in a solution comprising potassium hydroxide (KOH).

In some embodiments, the selective epitaxy is hydride vapor phase epitaxy (HVPE). In some embodiments, the HVPE utilizes ammonia gas, nitrogen gas, and/or hydrogen chloride gas. In some implementations, the HVPE is conducted at a temperature of between about 850° C. and about 1150° C. In some implementations, the HVPE is conducted at a pressure between about 10 Torr and about 760 Torr.

In some embodiments, at least a portion of the resulting core-shell structures formed in accordance with disclosed methods have inclined {1-101} sidewalls. In some embodiments, at least a portion of the resulting core-shell structures have vertical {1-100} sidewalls.

A method of fabricating an array of microstructures according to a disclosed embodiment comprises the steps of: providing an epilayer of gallium nitride (GaN) grown on a substrate; etching an array of pillars in the substrate, each of the etched pillars having a base portion and an upper portion; and selectively etching the base portion of the etched pillars to form an array of cylindrical microstructures, wherein the base portion has a first diameter and the upper portion has a second diameter at least about 2 times greater than the first diameter.

In some embodiments, the second diameter is at least about 10 times greater than the first diameter. In some embodiments, the first diameter is between about 50 nm and about 2 μm. In some embodiments, the second diameter is between about 250 nm and about 2 μm.

DETAILED DESCRIPTION OF EMBODIMENTS OF THE INVENTION

Embodiments of the present invention relate to dense arrays of large-area, vertically aligned GaN epitaxial core-shell micro- and nanopillar structures formed by a combination of top-down etching of pillars, and subsequent shell growth using selective epitaxy. According to disclosed embodiments, large-area gallium nitride (GaN) micro- and nanopillar (NP) arrays were fabricated by plasma etching of lithographically patterned GaN thin-film grown on a Si substrate. Deep-ultraviolet lithography, inductively coupled plasma (ICP) etching, and subsequent chemical treatments were effectively utilized to fabricate GaN pillars with diameters ranging from about 250 nm to about 10 µm.

Figure 1:
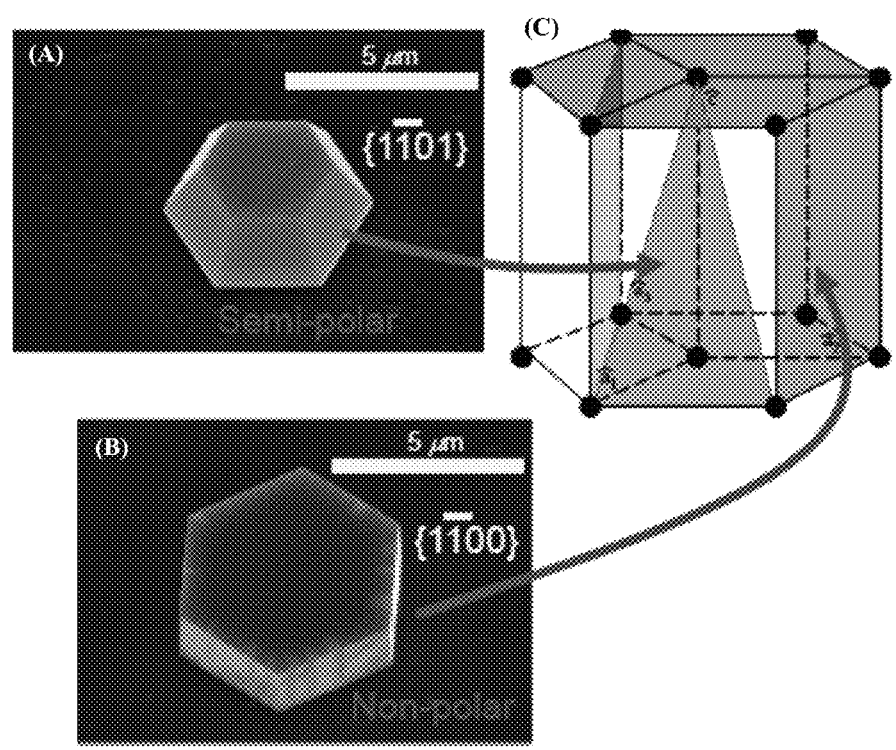
FIG. 1 shows GaN core-shell structures having semi-polar {1$\bar{1}$01} sidewalls (panels (A) and (C)) and non-polar {1$\bar{1}$00} sidewalls (panels (B) and (C)). The scale bar in each of panels (A) and (B) is 5 μm.

In some implementations, the two-step fabrication process comprises inductively coupled plasma (ICP) etching of lithographically patterned GaN-on-Si substrate to produce an array of micro- or NPs, followed by selective growth of GaN shells over these pillars using Hydride Vapor Phase Epitaxy (HVPE). The disclosed fabrication methods demonstrate excellent sidewall facet control in the shells, ranging from {1T01} semi-polar to {1T00} non-polar planes (FIG. 1), by employing a post-ICP chemical etch and by tuning the HVPE growth temperature.

Fabrication of GaN micro- and nanopillars with a variety of shapes and sizes is achieved using different plasma etch chemistries and process conditions. The disclosed methods provide the following attributes: (1) precise control over dimensions, shape, and morphology, (2) etch-damage free surfaces, (3) tailored profiles for specific applications, and (4) large-area uniformity and scalability. Embodiments demonstrate a top-down methodology that effectively combines lithography, plasma-etch, and chemical-etch for fabrication of high quality, large-area arrays of well-defined GaN micro- and nanostructures on a Si substrate that can be utilized in a variety of applications, including light-emitting diodes (LEDs), ultra-violet (UV) photodetectors, solar cells, and other photonic and electronic devices.

The conventional pendeo-epitaxy (PE) technique disclosed by Zheleva et al. (Zheleva, T. S. et al. (1999) "Pendeo-epitaxy: A New Approach for Lateral Growth of Gallium Nitride Films," J. Electron. Mater. 28:L5) utilizes selective epitaxial overgrowth of GaN bars oriented in particular crystallographic directions and separated by trenches. In contrast, fabrication methods in accordance with the present invention utilize pillars with different shapes and dimensions, which are formed by lithography and inductively coupled plasma (ICP) etching of GaN (0001) epitaxial film grown on Si substrates by MOVPE, followed by the epitaxial growth of shells using HVPE. The combination of lithography and etching enables scalable fabrication of NPs with improved dimensional control, uniformity, and optical quality. In addition, due to high growth rates, the HVPE pendeo-epitaxy (HVPE-PE) technique according to the present invention is advantageous for growing thick GaN shells with reduced dislocation density as compared to the traditionally used MOVPE-based PE. The resulting NP arrays can act as strain-free templates for subsequent epitaxial growth of n- and p-type group III-nitride structures enabling electrically active junctions along the semi- and nonpolar planes.

The impact of various plasma etching process parameters and chemical etchants on the surface morphology, optical properties, strain, and surface defects of the fabricated GaN micro and NPs were evaluated using scanning-electron microscopy, photoluminescence (PL), cathodoluminescence (CL), and Raman spectroscopy. As demonstrated herein, the shape of the NPs can be controlled by the substrate temperature during the plasma etch and by using different gas chemistries. Room temperature PL, CL, and Raman spectroscopy measurements revealed a substantial reduction of parasitic yellow luminescence as well as a significant strain relaxation in the core-shell structures. PL measurements also indicated that the surface damage from the plasma etch can be removed by etching in KOH-ethylene glycol solution. In addition, X-ray diffraction indicated improved crystal quality after shell formation.

Stress reduction is achieved due to the reduction of constraining interfaces in the nanostructures. Etch damage resulting from different ICP processes was compared using PL, whereby post-ICP wet chemical etching treatment is demonstrated as a means for its removal. Room temperature PL and Raman spectroscopy measurements reveal different levels of strain relaxation depending on the NP shape and size. Further, wet chemical etching in KOH is shown to further improve the optical and surface quality of the fabricated pillars by removing the plasma-damaged material from the side-walls. Additionally, formation of GaN micro- and nanodisks using selective Si etch is disclosed, which are suitable for various applications such as resonators and emitters.

Thus, the feasibility of ICP processing, post-ICP wet chemical etching and selective epitaxy on micro- and nano-engineered templates for realizing high-quality GaN-on-Si devices is demonstrated herein. Having described features and embodiments of the present invention, the same will be further understood through reference to the following additional examples and discussion, which are provided by way of further illustration and are not intended to be limiting of the present invention.

EXAMPLE 1

Fabrication

Figure 2:
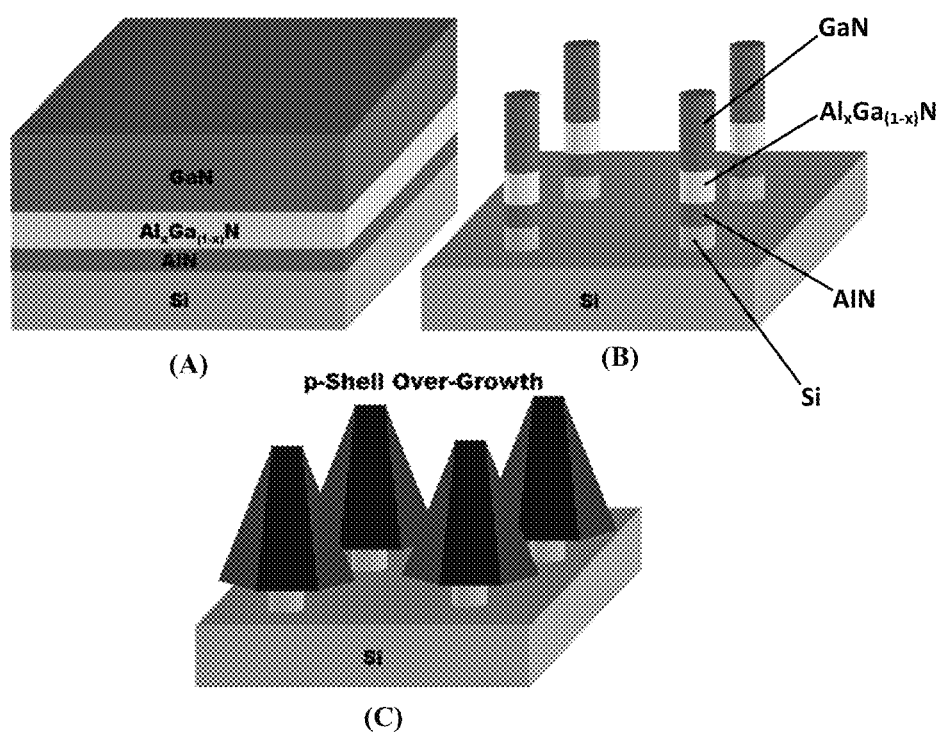
FIG. 2 is a schematic representation of a fabrication process of GaN core-shell structure in accordance with the present invention, including: as-grown layer structure (panel (A)), pillar formation by ICP etching (panel (B)), and after GaN shell overgrowth (panel (C)).

Referring to FIG. 2, a method of fabricating GaN core-shell pillars in accordance with an embodiment of the present invention is illustrated. Silicon (Si) doped n-GaN (0001) films were grown on Si (111) substrates in a commercial MOVPE reactor. First, AlN/Al$_{1-x}$Ga$_x$N buffer layer with varying x and thickness of about 125 nm was grown on the Si substrate, followed by deposition of about 0.75 µm thick GaN epilayer (FIG. 2, panel (A)). GaN wafers were patterned using deep UV lithography and metal liftoff. The etch-mask used was Ti/Ni (50 nm/120 nm) deposited using electron-beam evaporation.

Figure 3:
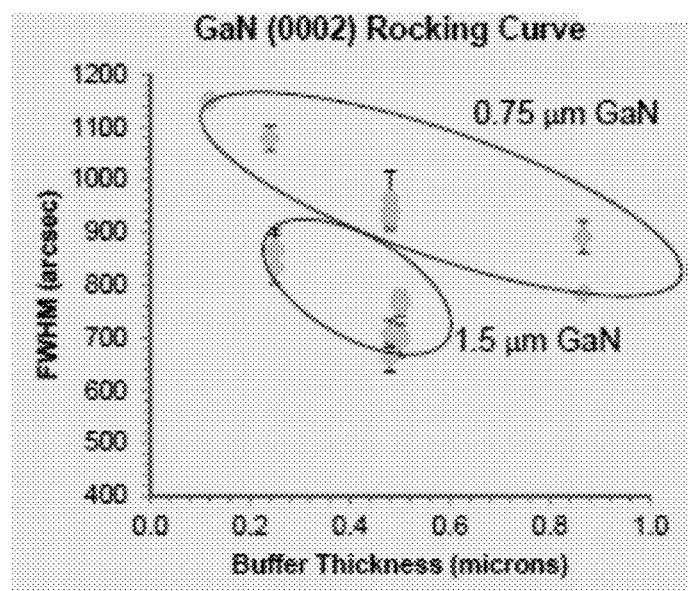
FIG. 3 shows X-ray diffraction (XRD) rocking curve measurements for epilayers with differing buffer thickness.
Figure 4:
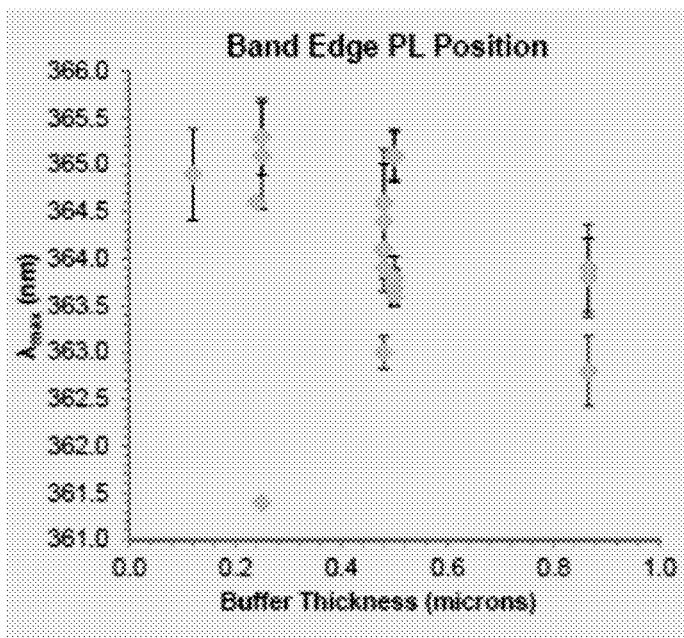
FIG. 4 shows room temperature near band edge (NBE) peak positions of the PL for epilayers with differing buffer thickness.

The AlN/Al$_{1-x}$Ga$_x$N buffer layer accounted for mismatch and reduced threading dislocations. X-ray diffraction (XRD) rocking curve measurements showed changes in full-width half maximum (FWHM) values with buffer thickness. FWHM values for 1.5 µm films were significantly lower as compared to values for 0.75 µm films (FIG. 3). In addition, room temperature near band edge PL of the epilayer exhibited a very slight red shift with decreasing buffer thickness (FIG. 4).

The patterned samples were then etched in an ICP system using a Cl$_2$/N$_2$/Ar gas mixture with flow rates of 25/5/2 standard cubic centimeters per minute (sccm). The ICP source power and radio frequency (RF) power were set at 1000 W and 500 W, respectively. The etching time was adjusted to provide complete removal of the unmasked GaN layer with subsequent removal of about 0.5 µm of the underlying Si substrate (FIG. 2, Panel (B)). After the ICP processing, the metal etch mask was removed in HF:HNO$_3$:H$_2$O (1:1:10) solution followed by deionized water rinse and nitrogen blow dry. GaN pillars of three different cross-sections, circles, squares, and diamonds, were formed with lateral dimensions ranging from 10 µm to 250 nm and pitches ranging from 20 µm to 0.5 µm during the dry etch process. The edges/vertexes of the square/diamond pillars were aligned along the GaN (1$\bar{1}$00) and (11$\bar{2}$0) directions.

Figure 5:
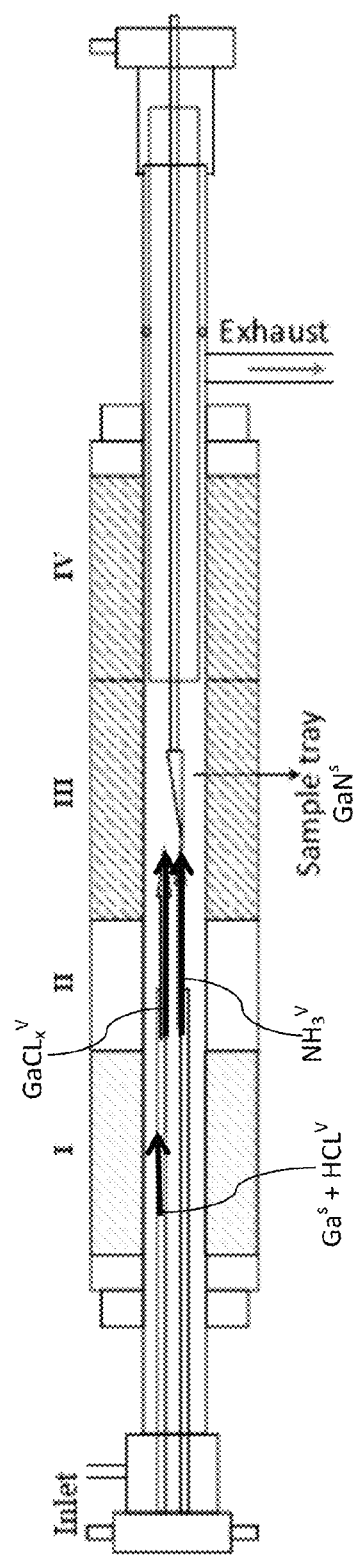
FIG. 5 is a schematic representation of a horizontal Hydride Vapor Phase Epitaxy (HVPE) reactor suitable for use with embodiments of the present invention.

Magnesium (Mg) doped GaN shells were epitaxially grown over the etched GaN pillars (FIG. 2, Panel (C)) in a horizontal HVPE reactor (FIG. 5). The overgrowth was performed at 980° C. to 1040° C. and 60 kPa (450 Torr). The GaCl$_x$ precursor gaseous species were synthesized by reacting HCl gas (6 sccm to 20 sccm) with molten Ga at 700° C. Ammonia at 200 sccm to 1500 sccm was used as the group V precursor and N$_2$ (5000 sccm) was the carrier gas. The Mg source for the p-type doping was biscyclopentadienyl-magnesium (Cp$_2$Mg). Post-growth activation of Mg-dopants was conducted in a rapid thermal annealing system at 750° C. for 15 min in Ar.

Results and Discussion:

After the growth of the core-shell structures, the samples were examined using a scanning electron microscope (SEM) and transmission electron microscope (TEM). Cross-sectional TEM samples were prepared by site specific in situ lift-out methods in a focused ion beam (FIB) instrument and subsequently observed in a 300 kV TEM instrument. Room-temperature PL and Raman scattering were collected using a 325 nm He—Cd laser and a 532 nm frequency doubled Nd:YAG laser excitation sources, respectively, and a high resolution spectrometer with an 800 nm focal length.

Figure 6:
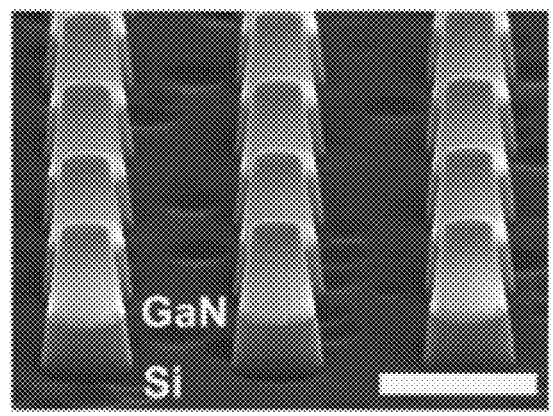
FIG. 6 is a SEM image of an array of as-etched GaN pillars with 0.5 μm diameter and 2.5 μm pitch. Tilted SEM images were taken at 70°; the scale bar is 2 μm.

A representative SEM image of an array of the etched GaN pillars with initial diameter of 0.75 µm and 2.5 µm pitch is shown in FIG. 6. Because of etch-mask erosion, the final tip diameters of the circular and square pillars were reduced to approximately 0.5 µm, and that of the diamond pillars to approximately 0.44 µm, all with approximately 80° tapering angle. The etched pillars had 0.9 µm of GaN on top of 0.5 µm of Si.

Figure 7:
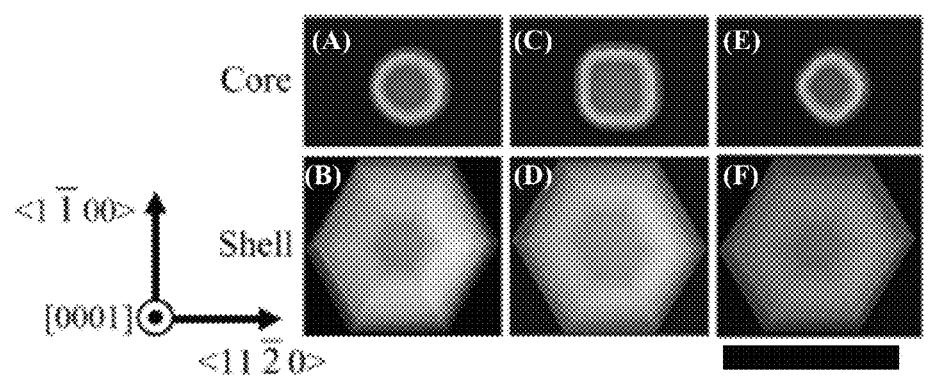
FIG. 7 are SEM images (plan view) of: circle-shaped pillars before and after p-shell growth (panels (A) and (B), respectively); square-shaped pillars before and after p-shell growth (panels (C) and (D), respectively); and diamond-shaped pillars before and after p-shell growth (panels (E) and (F), respectively). The scale bar is 2 μm.
Figure 8:
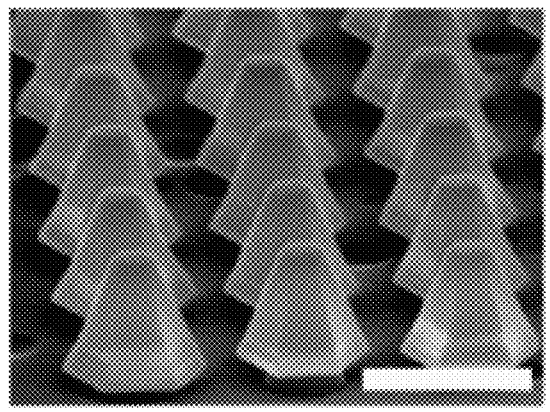
FIG. 8 is a SEM image of an array of p-shells grown for 10 min at 1020° C. and HCl/NH$_3$ flow rates of 6/200 (sccm) on 0.5 μm pillars. Tilted SEM images were taken at 70°; the scale bar is 2 μm.
Figure 9:
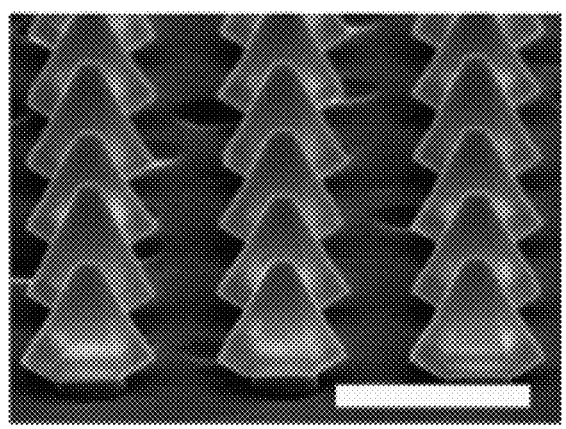
FIG. 9 is a SEM image of an array of p-shells grown for 10 min at 1020° C. and HCl/NH$_3$ flow rates of 6/200 (sccm) on 0.2 μm pillars. Tilted SEM images were taken at 70°; the scale bar is 2 μm.
Figure 10:
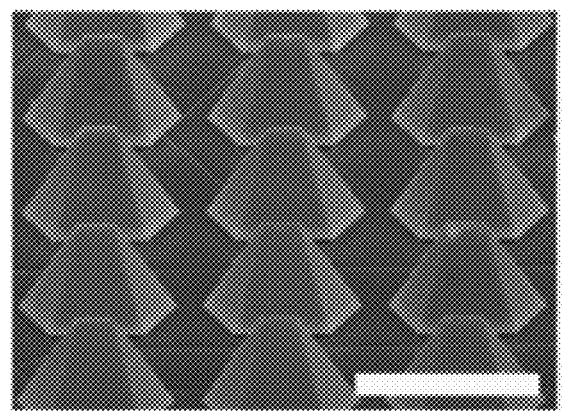
FIG. 10 is a SEM image of an array of p-shells grown for 5 min at 1040° C. and HCl/NH$_3$ flow rates of 20/1500 (sccm) on square pillars with 10 μm width and 20 μm pitch. Tilted SEM images were taken at 70°; the scale bar is 20 μm.
Figure 12:
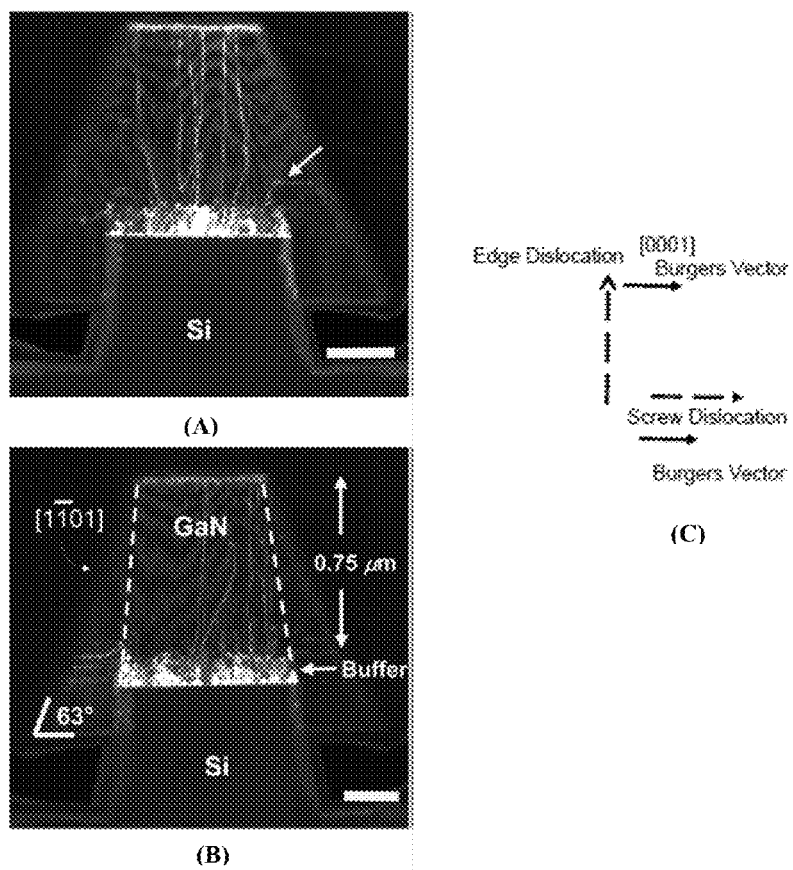
FIG. 12 are dark-field cross-sectional TEM images of two different core-shell structures with original square cores having diameters of about 0.5 μm (panels (A) and (B)). The cross-sections were prepared using FIB instrument. The arrow in panel (A) points to the bending of a dislocation as it crosses into the shell. Dashed lines in panel (B) outline the shape of the initial GaN core. Panel (C) shows dislocation direction relative to Burgers vector. The scale bar is 0.2 μm in panels (A) and (B).

The orientation of the different cross-section pillars relative to the GaN crystallographic directions is show in FIG. 7. Irrespective of the initial size/shape of GaN pillars, the HVPE overgrowth produced shells having a truncated hexagonal pyramid configuration for all growth conditions employed, as shown in FIGS. 7, 8, 9 and 10. The top c-plane facet progressively diminishes as the overgrowth proceeds. The side facets have a distinct approximately 62° angle from the horizontal, indicating that they are formed by {1$\bar{1}$01} planes, as shown in FIG. 12. The obtained core-shell pyramids are similar to those grown by SAE through dot-patterned dielectric masks on GaN films (Gibart, P. (2004) *"Metal Organic Vapour Phase Epitaxy of GaN and Lateral Overgrowth,"* Rep. Prog. Phys. 67:667). It is well-recognized that for both PE and epitaxial lateral overgrowth (ELO) of GaN, different side facets may appear depending on growth conditions and/or shape and orientation of GaN "seeds" (Chelda-Gourmala, O. et al. (2010) *"Complete HVPE Experimental Investigantions: Cartography of SAG GaN Towards Quasi-substrates or Nanostructures,"* J. Cryst. Growth 312:1899). In particular, different vertical and slanted facets are observed in both MOVPE and HVPE ELO of GaN if the stripe mask patterns are aligned along the (1$\bar{1}$00) or (11$\bar{2}$0) direction. However, the overgrowth procedure disclosed herein always yielded {1$\bar{1}$01} facets even for the round-shaped pillars (FIG. 7, panels (A) and (B)), the square-shaped pillars with nominally etched {1$\bar{1}$00} and {11$\bar{2}$0} sidewalls (FIG. 7, panels (C) and (D)), or the diamond-shaped pillars with other low-indexed sidewalls (FIG. 7, panels (E) and (F)).

The evolution of {1$\bar{1}$01} inclined facets rather than {1$\bar{1}$00} vertical facets may have been induced by the initial tapering of the as-etched pillars. The preference for the non-vertical sidewall formation is consistent with previous studies (see Liu, H.-P. et al. (2004) *"The Growth Mechanism of GaN Grown by Hydride Vapor Phase Epitaxy in N$_2$ and H$_2$ Carrier Gas,"* J. Cryst. Growth 260:79), where GaN pillars always terminated with inclined {1$\bar{1}$01} facets when non-hydrogen carrier gas was used in the HVPE system.

Figure 11:
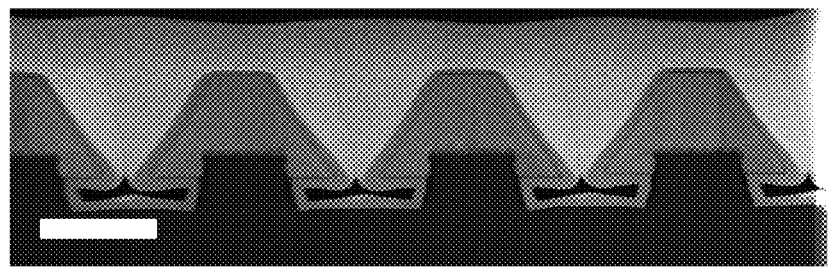
FIG. 11 is a dark-field cross-sectional TEM image of core-shell structures prepared using FIB instrument. The scale bar is 1 μm.

Cross-sectional dark-field TEM images of the core-shell pillars are shown in FIGS. 11 and 12. Note that the growing shell extends below the original interface between GaN film and Si substrate. The growth rate appears to be higher for the bottom plane of the GaN shell than its top (0001) surface. Since no GaN was deposited on the Si substrate due to the selectivity of HVPE process, it is believed that this growth enhancement is associated with diffusion of the reactants from the Si surface toward GaN pillars (Mitchell, C. C. et al. (2001) *"Mass Transport in the Epitaxial Lateral Overgrowth of Gallium Nitride,"* J. Cryst. Growth 222:144-153).

As evident from FIG. 12, dislocations in the pillars do not propagate vertically into the shells. Most of the observed dislocations exhibited a 90° bend from their initial propagation direction when they reached the {1$\bar{1}$01} facets and finally propagated parallel to the basal plane in the shells. Threading dislocations commonly observed in GaN are of three types: (1) edge dislocations with Burgers vector b=±(11$\bar{2}$0), screw dislocations with b=±(0001), and mixed dislocations with b=±(11$\bar{1}$0)±(0001) (see FIG. 12, panel (c)). Bending of dislocations has been observed in ELO of GaN (Craven, M. D. et al. (2002) *"Threading Dislocation Reduction via Laterally Overgrown Nonpolar (11$\bar{2}$0) a-plane GaN,"* Appl. Phys. Lett. 81:1201). The energy of a dislocation depends on its Burgers vector and its propagation direction, which is dictated by energy minimization (Gradecak, S. et al. (2004) *"Bending of Dislocations in GaN During Epitaxial Lateral Overgrowth,"* Appl. Phys. Lett. 85:4648). For the edge dislocations, the propagation direction with minimum energy is parallel to its Burgers vector, which would correspond to a 90° bend, converting an edge dislocation into a pure screw dislocation.

Figure 13:
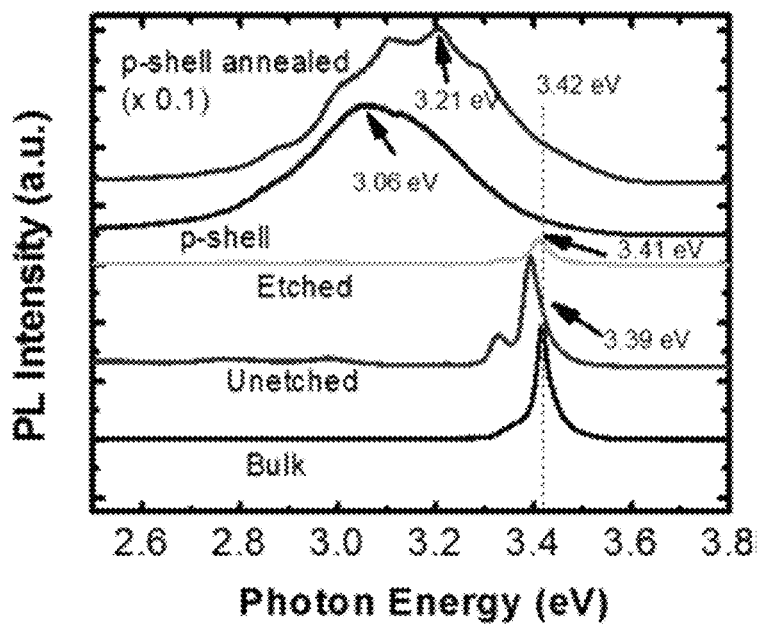
FIG. 13 shows room temperature PL spectra of bulk GaN, unetched thin film, etched pillars, after p-shell growth, and after the activation anneal. The vertical dashed line indicates the peak position of room-temperature NBE of strain-free GaN. The etched sample showed significant reduction in intensity. The PL intensity of activated p-shell increased by a factor of 10 as compared to the as-grown shell.

Room-temperature PL spectra of the GaN epilayer, etched pillars, and overgrown shells (before and after Mg activation) are shown in FIG. 13. For comparison, the PL spectra from a free-standing, stress-free 3 mm thick GaN sample grown by HVPE method is also plotted. For the etched pillars and the p-shells, the spectra were taken from the 10 µm diameter structures to enhance the intensity of the peaks, although the trend is similar for smaller diameter structures. At room-temperature, the near-band edge (NBE) transition observed in GaN has been attributed to band-to-band recombination as well as to excitonic recombination (Schubert, E. F. et al. (1997) "Optical Properties of Si-doped GaN," Appl. Phys. Lett. 71:921).

The thin GaN epilayer clearly exhibits a tensile-strain induced 30 meV red-shift of the NBE emission peak, as compared to the bulk NBE peak. This is in agreement with previous studies on GaN thin-film grown on Si substrate, where the GaN is under biaxial tensile-strain (Zhao, D. G. et al. (2003) "Stress and Its Effect on Optical Properties of GaN Epilayers Grown on Si (111), 6H-SiC (0001), and c-plane Sapphire," Appl. Phys. Lett. 83:677). The peak at 3.33 eV present in the un-etched sample has been observed in the PL spectra of GaN grown on Si, and is often attributed to the donor acceptor pair (DAP) transitions (Yablonskii, G. P. et al. (2002) "Luminescence and Stimulated Emission from GaN on Silicon Substrates Heterostructures," Phys. Status Solidi A 192:54; Tung, L. T. et al. (2009) "Photoluminescence and Raman Studies of GaN Films Grown by MOCVD," J. Phy.: Conf. Ser. 187:012021). The 20 meV blue-shift of the NBE emission of the etched sample indicates partial strain-relaxation due to etching. Such blue-shift in PL has also been observed for etched GaN nanocolumns on Si (Thillosen, N. et al. (2006) "The State of Strain in Single GaN Nanocolumns As Derived from Micro-Photoluminescence Measurements," Nano Lett. 6:704-708). Growth of the Mg-doped p-shell substantially changes the emission characteristics, as seen in FIG. 13, with the disappearance of the NBE peak and evolution of broad emission centered at 3.06 eV for the as-grown shell. Activation annealing of the shell at 750° C. in Ar resulted in an increase in the overall intensity with the emission peak blue-shifted to 3.21 eV. In MOVPE grown Mg-doped GaN, the 2.95 eV emission band is believed to be due to conduction band to deep-level (or complexes) transitions, and the 3.21 eV emission band is due to conduction band to shallow Mg acceptor level transitions (Smith, M. et al. (1996) "Mechanisms of Band-edge Emission in Mg-doped p-type GaN," Appl. Phys. Lett. 68:1883). This agrees with the observed results, i.e., in the case of the as-deposited shell the Mg complexes dominate the PL, whereas after the activation anneal the shallow acceptors dominate the transitions.

Figure 14:
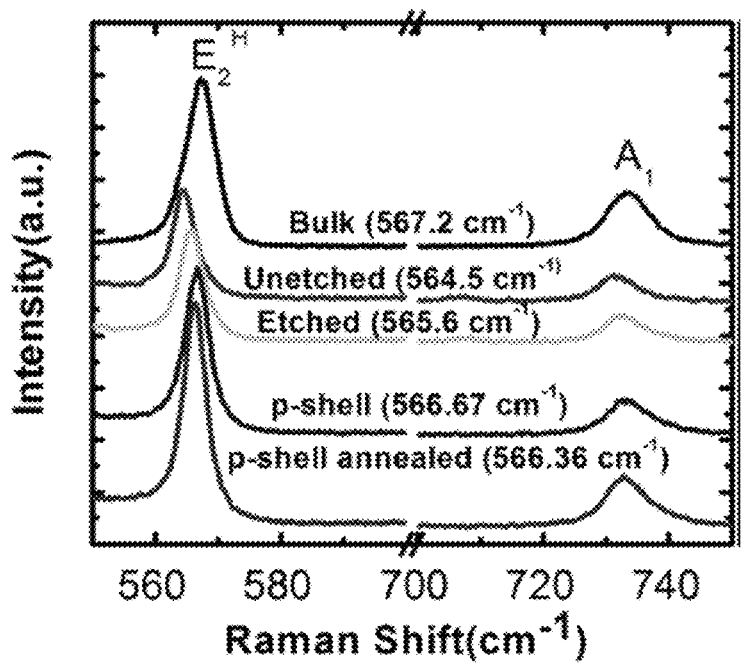
FIG. 14 illustrates graphically room temperature Raman scattering spectra from bulk GaN, unetched thin film, etched pillars, after p-shell growth, and after the Mg activation anneal. The position of $E_2^H$ is identified in parenthesis.

The biaxial strain in hexagonal GaN is most conveniently probed through the $E_2^H$ phonon mode in Raman scattering, as it is most sensitive to biaxial strain in c-plane and is the most intense (Harima, H. (2002) "Properties of GaN and Related Compounds Studied by Means of Raman Scattering," J. Phys.: Condens. Matter 14:R967). FIG. 14 illustrates graphically the room-temperature Raman scattering spectra in the back-scattering geometry from the unetched GaN thin film, 10 µm diameter circular pillars, after p-type shell growth, and after Mg-activation anneal. For comparison, the Raman spectrum from the 3 mm thick bulk GaN is also shown. Compared to the standard value of strain-free $E_2^H$ peak (567.6 cm$^{-1}$) (Davydov, V. Y. et al. (1998) "Phonon Dispersion and Raman Scattering in Hexagonal GaN and AlN," Phys. Rev. B 58:12899), the as-grown GaN on Si exhibits tensile strain, evident in the red-shifted (3.5 cm$^{-1}$) $E_2^H$ peak. The blue-shift (1.1 cm$^{-1}$ from the unetched sample) of the $E_2^H$ peak after plasma etching is in agreement with the PL results, indicating the partial strain relaxation due to etching. Assuming the stress coefficient for the Raman shift for the $E_2^H$ mode for GaN on Si is 2.9 cm$^{-1}$ GPa$^{-1}$ (Harima, H. (2002) "Properties of GaN and Related Compounds Studied by Means of Raman Scattering," J. Phys.: Condens. Matter 14:R967), a relaxation of 0.37 GPa in the 10 µm diameter pillars due to etching is computed. Further blue shifting of the $E_2^H$ peak due to the shell growth may be due to the compressive effect of the conformal epitaxial growth, where the GaN core is hydrostatically compressed by the shell.

Vertically aligned GaN core-shell structures are demonstrated herein using a combination of top-down etching and selective area shell growth on the etched pillars. As-etched pillars clearly showed strain-relaxation manifested in blue-shift in both PL and Raman scattering spectra. Following the epitaxial shell overgrowth, the strain was further reduced. In addition, cross-sectional TEM images of the core-shell structures (FIGS. 11 and 12) revealed reduction in dislocation density in the shells.

The disclosed structures have potential for various applications, such as photodetectors, light-emitters, and field-emitters requiring large-area arrays of nanoscale sub-components.

EXAMPLE 2

Fabrication

Nominally undoped 0.8 µm to 1.5 µm thick GaN epitaxial layers were grown by metalorganic chemical vapor deposition on a 4-in. Si (111) substrate. Intermediate $Al_{1-x}Ga_xN$ buffer layers with varying x and thickness of 150 nm were grown on Si (111) prior to GaN growth. After the GaN growth, 50 nm of $Si_3N_4$ was deposited on the entire wafer. The GaN wafers were patterned using deep UV lithography, and Ti/Ni (50 nm/120 nm) was deposited by electron-beam evaporator to serve as a metal etch-mask. After metal lift-off, arrays of circular Ti/Ni metallization remained with diameters (D) ranging from 10 µm to 250 nm and pitches from 20 µm to 500 nm.

For inductively coupled plasma (ICP) etching, the wafers were diced into 20 mm×20 mm square pieces and mounted on a Si carrier wafer coated with 50 nm atomic layer deposited $Al_2O_3$. The samples were etched in an Oxford PlasmaLab 100 ICP system with an Oxford remote ICP380 source. After the ICP etching, the samples were put in $HF:HNO_3:H_2O$ (1:1:10) solution for 2 min to remove the etch mask. The samples were then observed in a field-emission scanning electron microscope (FESEM, Hitachi S4700). An integrated HORIBA Jobin Yvon's LabRAM 800HR bench-top system was used for PL (Kimmon He—Cd, 325 nm) and Raman spectroscopy (Laser Quantum DPSS, 532 nm) measurements with typical laser spot sizes of about 50 µm and about 1 µm, respectively.

For post-ICP damage removal, 10% (mass fraction) KOH in ethylene glycol solution was used. For an isotropic wet etching of silicon, the samples were dipped in $HF:HNO_3:CH_3COOH$ (1:25:25) solution at room-temperature for 1 min.

Figure 15:
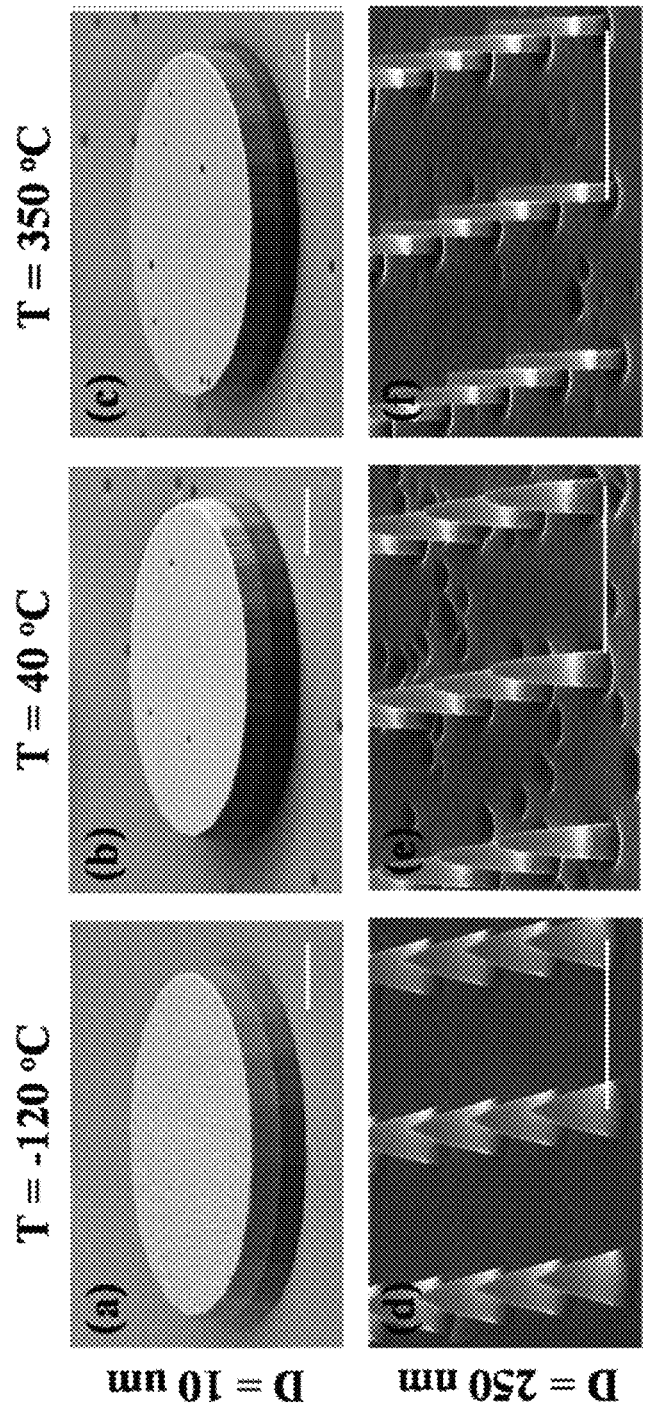
FIG. 15 are FESEM images of GaN pillars etched using the indicated diameter (D) of 10 μm and 250 nm of metal mask starting circular patterns (panels (a), (b) and (c)) etched using Cl$_2$/N$_2$/Ar (25/5/2 sccm) gas mixture at three different substrate temperatures (T): −120° C. (panels (a) and (d)), 40° C. (panels (b) and (e)), and 350° C. (panels (c) and (f)). The scale bars indicate 2 μm.

Results and Discussion:

A. Effects of Substrate Temperature During ICP Etch:

FIG. 15 (panels (a-f)) are FESEM images of etched pillars with 10 µm and 250 nm diameter starting circular patterns etched using $Cl_2/N_2/Ar$ (25/5/2 sccm) gas mixture at three different substrate temperatures (T): −120° C. (panels (a) and (d)), 40° C. (panels (b) and (e)), and 350° C. (panels (c) and (f)). The other etch parameters such as ICP power (800 W), RF power (300 W), pressure (5 mTorr), and etching time (5 min) were kept constant. At lower etch temperature, significant tapering of the side wall angle was seen in smaller diameter structures.

FIG. 15, panel (d), shows the cone shape pillars with base diameter of 680 nm and sloped sidewall angle of 75°. For such small diameter pillars, significant lateral etching of the metal mask at −120° C. was seen, which is believed to be the cause for the formation of the relatively sharp tips. Of note, the sidewall angle increased with increasing temperature (FIG. 15, panels (d), (e) and (f), respectively). Sloped sidewalls at lower temperatures indicate a sputter-dominated regime with limited volatility of etch products (Paramanik, D. et al. (2012) "Formation of Large-area GaN Nanostructures with Controlled Geometry and Morphology Using Top-down Fabrication Scheme," J. Vac. Sci. Technol. B 30:052202). At lower cathode temperatures, the etch product ($GaCl_3$) is solid given that its melting point at atmospheric pressure is 77.9° C. As the temperature increases, the rate of chemical etching increases, which enhances uniform lateral etching of the sidewalls, leading to vertical NP sidewalls at 350° C. (FIG. 15, panel (f)).

Figure 16:
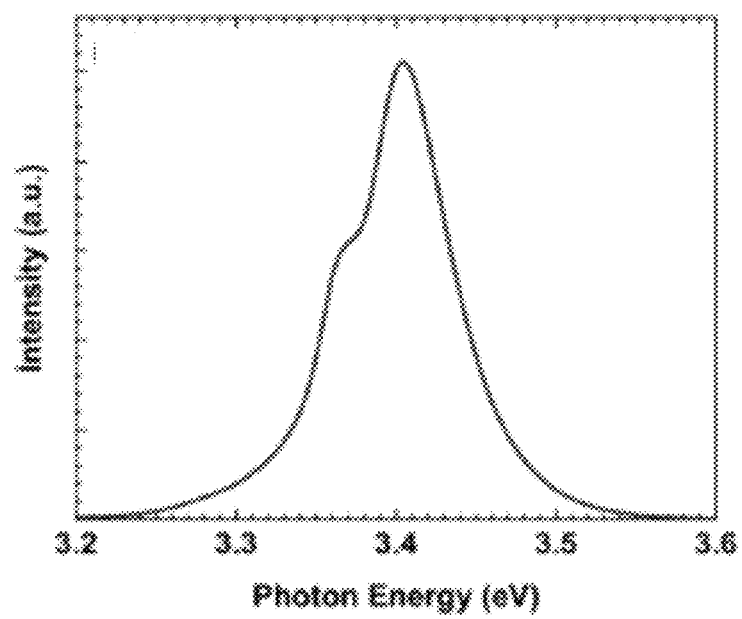
FIG. 16 illustrates graphically representative room temperature near band edge PL of the pillars shown in FIG. 15, panel (f), fabricated with metal mask of diameter 0.25 μm at 350° C.
Figure 17:
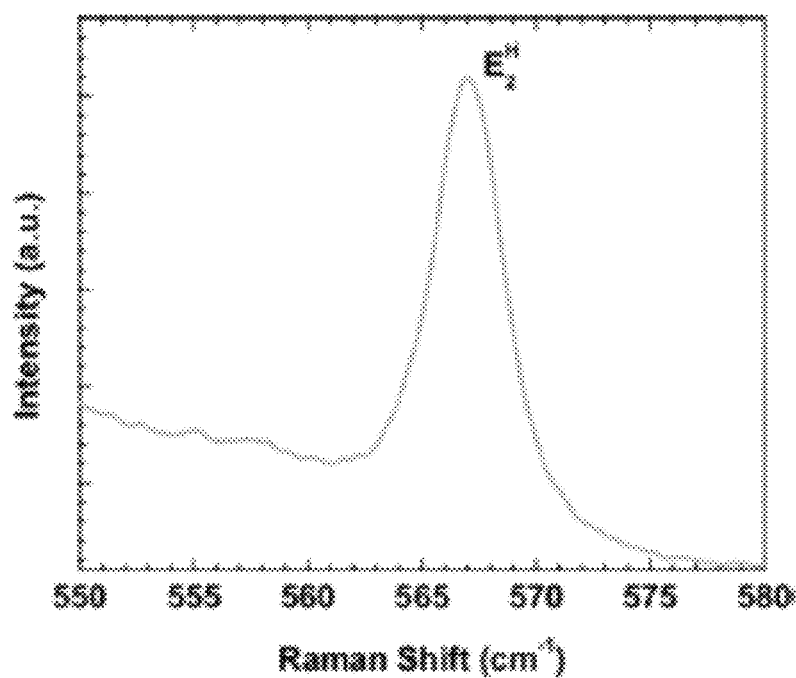
FIG. 17 illustrates graphically representative room temperature Raman $E_2^H$ spectra of the pillars shown in FIG. 15, panel (f), fabricated with metal mask of diameter 0.25 μm at 350° C.
Figure 18:
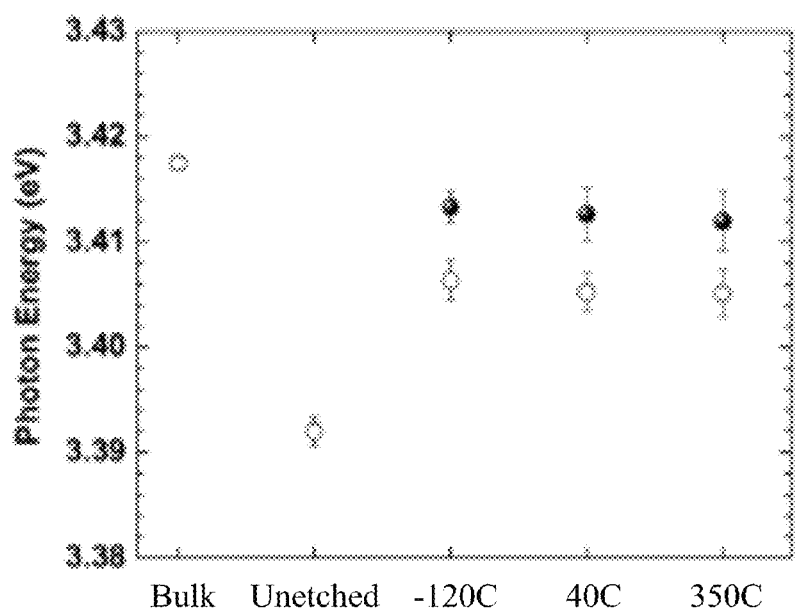
FIG. 18 illustrates graphically peak positions of room temperature PL spectra of the pillars shown in FIG. 15. Open circles correspond to the pillars fabricated with metal mask and having diameters of 10 μm whereas the solid circles represent the same for pillars having diameters of 250 nm. The data for the bulk and unetched GaN samples (open circles) are also shown for comparison.

B. Optical Properties of Etched Pillars:

Optical properties of the NPs were measured using PL (FIG. 16) and Raman spectroscopy (FIG. 17) in order to understand the strain relaxation of GaN-on-Si structures as compared to the unetched films. FIG. 18 represents the near band-edge (NBE) peak positions of the PL measured on the structures shown in FIG. 15. For comparison, also included was the NBE position from a free-standing, stress-free 3 mm thick GaN sample grown by HVPE. As-grown GaN films experience significant in-plane tensile stress due to the large mismatch in the thermal expansion coefficients between GaN and Si, which result in a red-shift of the NBE peak position in the PL as compared to the strain-free material (Krylyuk, S. et al. (2012) "Large-area GaN n-core/p-shell Arrays Fabricated Using Top-down Etching and Selective Epitxial Overgrowth," Appl. Phys. Lett. 101:241119). The clear blue shift of the NBE peaks for all the etched samples in FIG. 18 from the thin film value implies that the pillars are strain-relaxed compared to the GaN thin film. Similar compressive stress relaxation was observed in GaN NPs fabricated on sapphire substrate (Wang, Y. D. et al. (2005) "High Optical Quality GaN Nanopillar Arrays," Appl. Phys. Lett. 86:071917; Demangeot, F. et al. (2002) "Optical Investigation of Micrometer and Nanometer-size Individual FaN Pillars Fabricated by Reactive Ion Etching," J. Appl. Phys. 91:6520). The level of strain relaxation is greater in structures etched from 250 nm features, as compared to 10 µm features.

Figure 19:
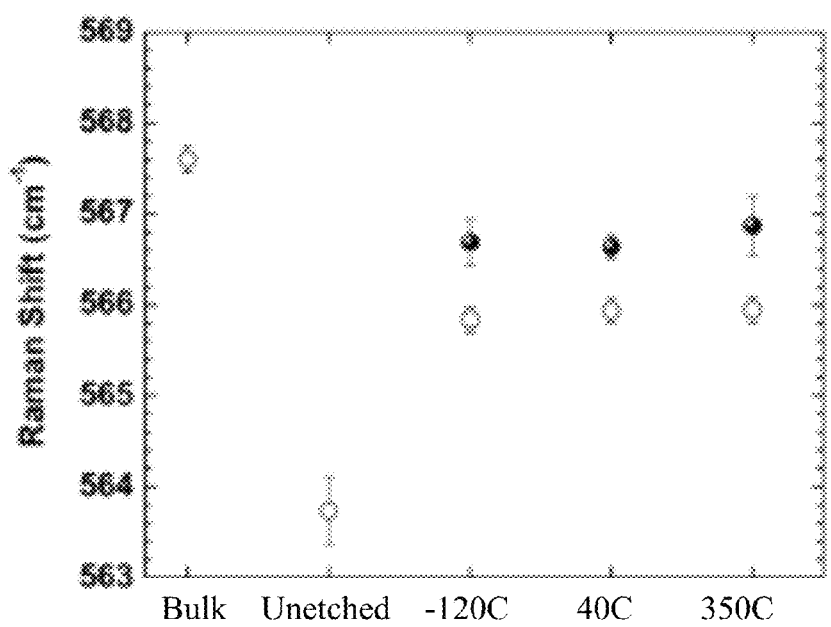
FIG. 19 illustrates graphically peak positions of room temperature Raman scattering spectra of the pillars shown in FIG. 15. Open circles correspond to the pillars fabricated with metal mask having diameters of 10 μm whereas the solid circles represent the same for pillars having diameters of 250 nm. The data for the bulk and unetched GaN samples (open circles) are also shown for comparison.

FIG. 19 summarizes the $E_2^H$ peak position of Raman scattering for different structures shown in FIG. 15. The same trend is evident in Raman scattering measurement, i.e., blue-shift of the etched structures indicates strain-relaxation due to ICP etching. In addition, the $E_2^H$ mode for NPs etched at 350° C. in FIG. 15, panel (f), appear to be shifted toward higher wave number as compared to others. Thus, these NPs fabricated at higher temperature appear to be most strain-relaxed, which is expected considering their small overall diameter.

Figure 20:
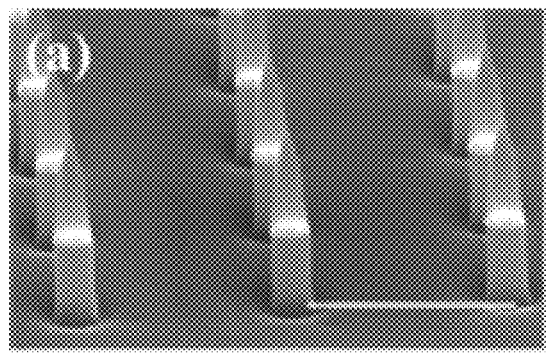
FIG. 20 are FESEM images of GaN NPs etched at different plasma chemistry: Cl$_2$/He/Ar (25/5/2 sccm) at 40° C. (panel (a)); and Cl$_2$/H$_2$/Ar (25/5/2 sccm) at 40° C. (panel (b)). The starting mask pattern was 250 nm diameter circles. For comparison, see FIG. 15, panel (f), for Cl$_2$/N$_2$/Ar (25/5/2 sccm) etch. The scale bars indicate 2 μm.
Figure 20:
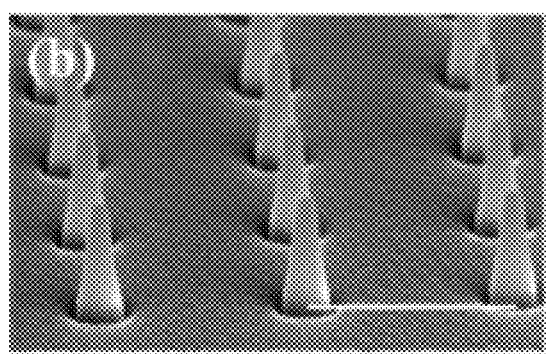

C. Gas Chemistry Dependent Etching Behavior:

The morphologies of the NPs fabricated at room temperature using different gas chemistries are shown in FIG. 20. By measuring the height of the NPs etched at different etch conditions, it is clear that the etch rate is much lower for the $Cl_2/H_2/Ar$ (25/5/2 sccm) chemistry than for $Cl_2/He/Ar$ (25/5/2 sccm) and $Cl_2/N_2/Ar$ (25/5/2 sccm). Similar suppression of the GaN etch rate with addition of $H_2$ has been observed for $Cl_2/Ar$ plasma and was attributed to the consumption of reactive Cl radical by H, forming HCl (Shul, R. J. et al. (1998) "Selective Inductively Coupled Plasma Etching of Group-III Nitrides in $Cl_2$— and $BCl_3$-based Plasmas," J. Vac. Sci. Technol. A 16:1621).

Figure 21:
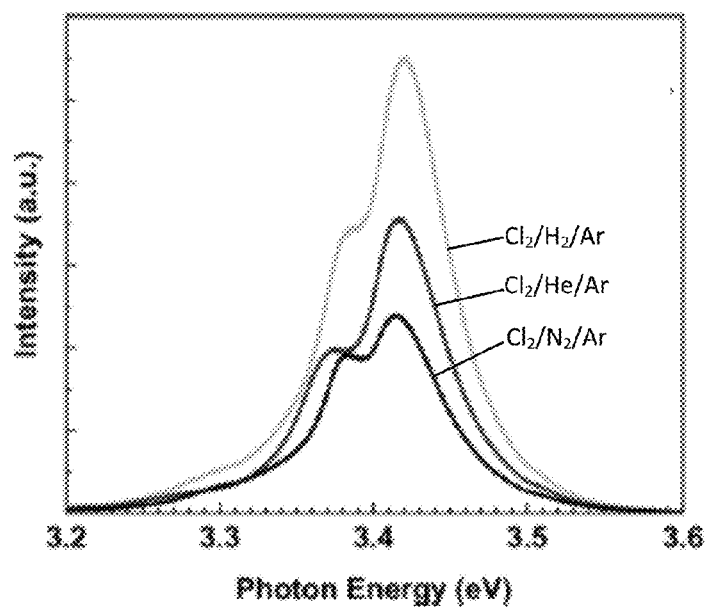
FIG. 21 illustrates graphically room temperature PL spectra of the pillars shown in FIG. 20 and FIG. 15, panel (f).

FIG. 21 shows the room temperature NBE PL spectra from the NPs of FIG. 20 and FIG. 15, panel (f). There is no significant shift in the peak position. However, NPs fabricated using the $Cl_2/H_2/Ar$ (25/5/2 sccm) chemistry exhibit the most intense PL peak. Although the surface areas and volumes are different for all three different etch structures, simple calculations indicate that these differences are not sufficient to account for the observed differences in the PL intensities of the three samples. The difference in PL intensities for the three different etch chemistries was consistent across all three samples. As decrease in the PL intensity can be associated with increase in surface nonradiative recombination of photocarriers, the highest NBE PL intensity observed for the $H_2$ chemistry may be attributed to the lower surface defect density produced by the etch. However, the pillar geometry may also affect the light-coupling efficiency, which can account for the observed PL intensity enhancement. Comparing atomic mass of hydrogen (1.007 amu), helium (4.002 amu), and nitrogen (14.006 amu), it appears that the smaller mass of hydrogen atom might lead to lower damage of the etched surface, when other gases and processing parameters remain the same in the etch process.

Figure 22:
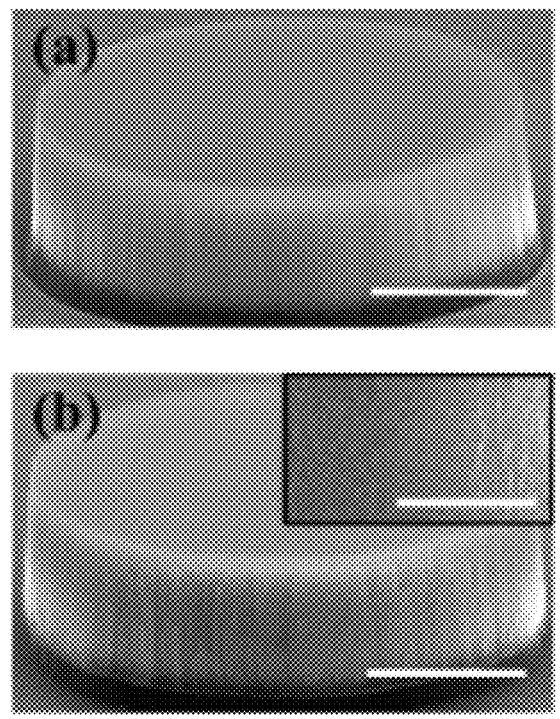
FIG. 22 are FESEM images of GaN NPs etched after ICP etching at T 40° C. (panel (a)), and followed by wet etch in a solution of (10%) KOH in ethylene glycol (panel (b)). The inset image in panel (b) shows a magnified image of the side wall with surface texturing. The scale bars indicate 1 μm.

D. Wet Chemical Etch of GaN Pillars:

FIG. 22 shows the morphology of the sidewall surface of GaN pillars after ICP etching and after subsequent wet chemical etching using 10 wt. % KOH in ethylene glycol for 10 min at 40° C. The KOH wet etching produced microfacets on the side walls but not on the top surface. The polarity-selective nature of KOH etching process is well known, where N-polar planes are etched while Ga-polar planes remain unaffected due to the different states of the surface bonding (Zhuang, D. & Edgar, J. H. (2005) "Wet Etching of GaN, AlN, and SiC: A Review," Mater. Sci. Eng. R 48:1). Stocker et al. reported the evolution of $\{10\bar{1}0\}$ plane by etching cleaved GaN in 10 wt. % KOH dissolved in ethylene glycol at 165° C. (Stocker, D. A. et al. (1998) "Crystallographic Wet Chemical Etching of GaN," Appl. Phys. Lett. 73:2654). The reported etch-rate for the m-plane in (10-50)% KOH in ethylene glycol at 90° C. was 1.5 nm/min, whereas etch rate for c-plane was insignificant. Thus, the microfacets observed on the side walls here are believed to be the $\{10\bar{1}0\}$ planes.

Figure 23:
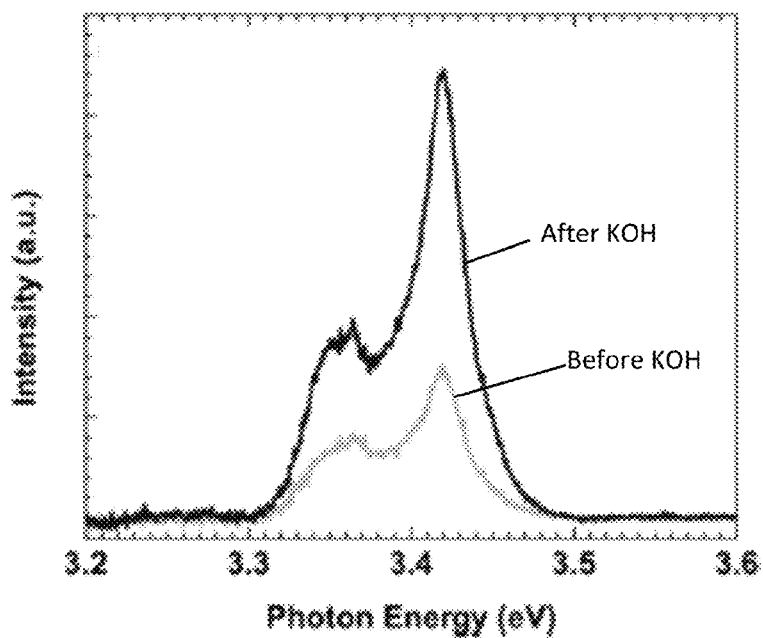
FIG. 23 illustrates graphically room temperature PL spectra of the NPs of FIG. 22 before and after KOH treatment, and showing enhancement of the intensity after KOH treatment.

To demonstrate the effectiveness of KOH based etchant for plasma etch-damage removal, the temperature was kept relatively low (i.e., 40° C.) to ensure very slow etch rate. Under these conditions, the KOH wet etching produced surface texturing on the side walls of the GaN NPs (FIG. 22, panel (b)). Significant enhancement in the room temperature PL intensity was observed after the KOH etching as compared to the ICP etched NPs, as shown in FIG. 23. This PL intensity enhancement may result from either the removal of the surface plasma-induced defects (acting as nonradiative recombination centers), or from enhanced light extraction due to the texturing of the side-walls, or both.

Figure 24:
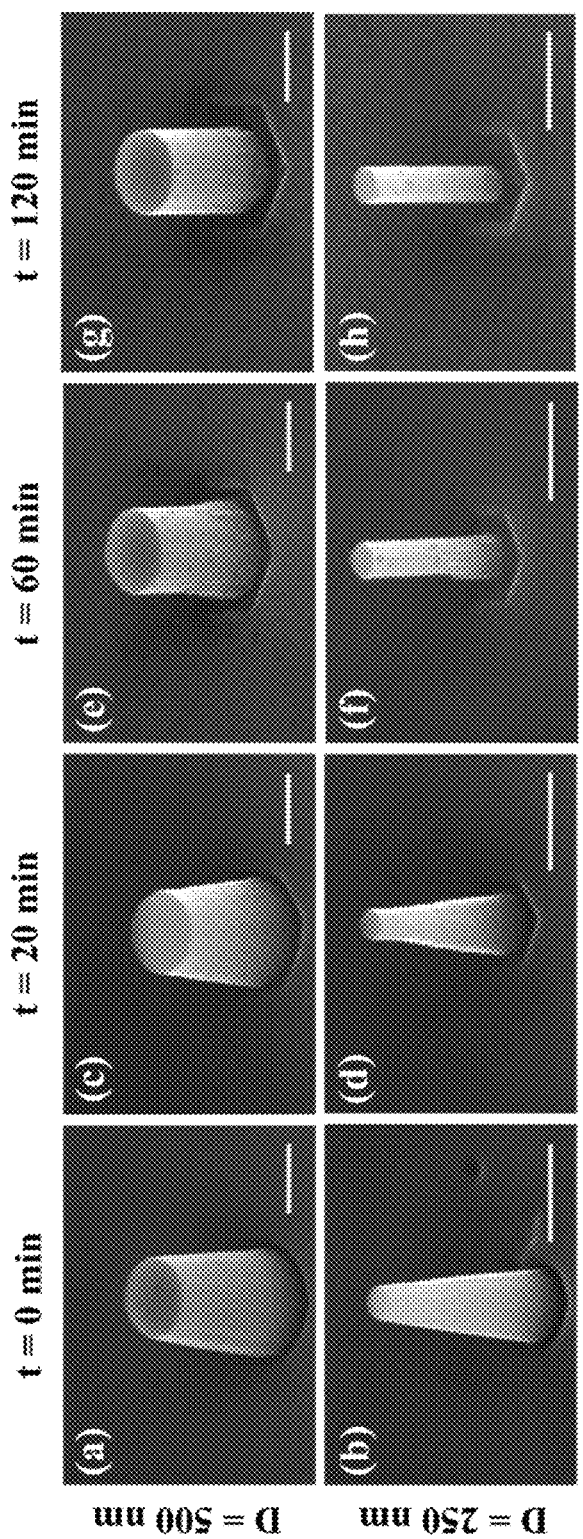
FIG. 24 are FESEM images of KOH treated GaN NPs showing the evolution of different morphology as a function of different etching time (t), at 0 minutes (panels (a) and (b)), 20 minutes (panels (c) and (d)), 60 minutes (panels (e) and (f)), and 120 minutes (panels (g) and (h)). The wet chemical etch is carried out at 80° C. using 10% KOH in ethylene glycol. NPs are fabricated using metal masks with 500 nm diameters (panels (a), (c), (e) and (g)) and 250 nm diameters (panels (b), (d), (f) and (h)). The scale bars indicate 500 nm.

Smaller diameter (500 nm and 250 nm) NPs were also etched at higher temperature (80° C.) with KOH in ethylene glycol for different duration (FIG. 24). 1.5 µm thick GaN epilayer was used, and etched down with about 0.5 µm of GaN remaining on the surface. This permitted longer etching duration in the KOH solution not otherwise possible if Si was exposed at the base of these pillars. Preferential etching of Si would have resulted in removal of the pillars from the surface. Microfacets were evident after 20 min of etching. Reduction of the tapering with uniform diameters along the height of the NPs was observed after 120 minutes of etching. Reduction of the tapering may be explained by the removal of faster-etching planes, leaving slower-etching $\{10\bar{1}0\}$ m-planes along the height of the pillar.

The absence of detrimental polarization induced charges and associated electric field in the nonpolar devices is thus an important aspect to realizing high-performance light-emitting devices. Thus, NPs with vertical sidewalls may be used as templates for engineering device heterostructures with active nonpolar interfaces.

EXAMPLE 3

Previous attempts to fabricate nitride based microdisks using various selective chemical etching methods resulted in very large structures with diameters ranging from 5 µm to 200 µm and with very rough side walls (Tamboli, A. C. et al. (2007) "Room-temperature Continuous-wave Lasing in GaN/InGaN Microdisks," Nature Photon. 1:61; Choi, H. W. et al. (2006) "Lasing in GaN Microdisks Pivoted on Si," Appl. Phys. Lett. 89:211101; Vicknesh, S. et al. (2007) "Fabrication of Deeply Undercut GaN-based Microdisk Structure on Silicon Platforms," Appl. Phys. Left. 90:071906). In contrast, fabrication methods according to disclosed embodiments that use selective wet chemical etch result in free-standing arrays of GaN micro- and nanodisk structures on Si substrate.

Figure 25:
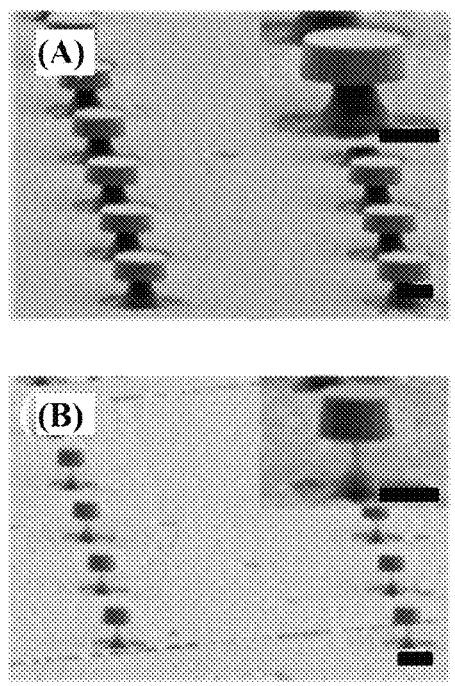
FIG. 25 are FESEM images of GaN microdisk arrays (panel (A)) and nanodisk arrays (panel (B)) fabricated using ICP etch and subsequent selective Si etching by HNA solution. The scale bars indicate 1 μm; inset scale bars indicate 500 nm. The inset image in panel (A) shows a single microdisk with diameter of about 2 μm with base silicon undercut diameter of about 1 μm. The inset image in panel (B) shows a single nanodisk with diameter of about 500 nm with base Si undercut diameter of 50 nm.

Fabrication:

The wet chemical etching was done using a solution of HF, $HNO_3$, and $CH_3COOH$ (HNA, 1:25:25 by volume) at room temperature to selectively etch Si at the base of the GaN pillars producing an undercut (FIG. 25). GaN micro-disk structures having a top diameter of about 2 µm and a Si base pillar diameter of about 1 µm were achieved (FIG. 25, panel (A)). Further, GaN nanodisk structures having a top diameter of about 500 nm and a fine Si nanopillar diameter of about 50 nm were achieved (FIG. 25, panel (B)). The etching rate of Si is very sensitive to the etchant solution temperature and etching time. At 25° C., the etching rate of Si was found to be (400-500) nm/min while the etching rate of GaN was negligible. The GaN micro- and nanodisks with small diameter, smooth sidewalls, and excellent uniformity over a large area were fabricated on the same substrate.

Figure 26:
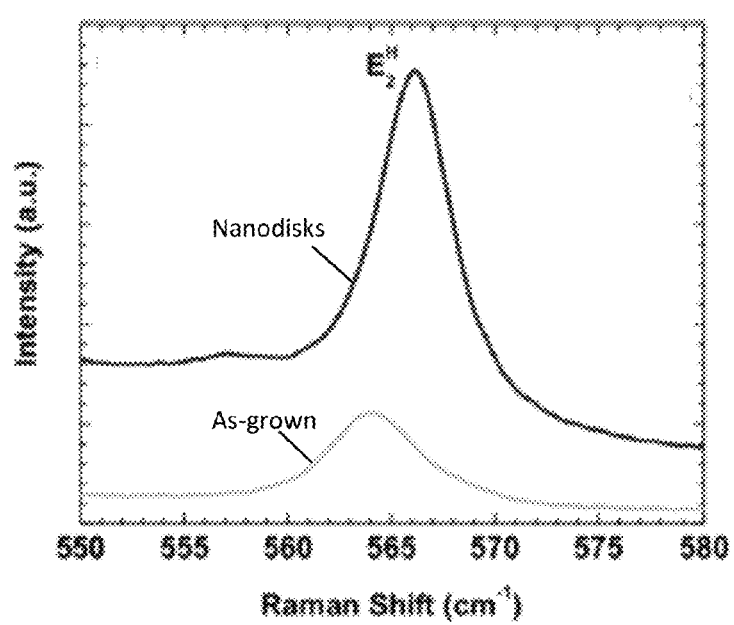
FIG. 26 shows room temperature Raman scattering spectra from the nanodisk structures of FIG. 25, panel (b), along with the as grown film.

Discussion:

Raman spectroscopy data of the fabricated nanodisks was compared with that of as-grown film (FIG. 26). The $E_2^H$ peak positions for GaN thin film and nanodisk structures was found to be at 564.2 and 566.3 $cm^{-1}$, respectively. This indicates that the nanodisk structures are more strain-relaxed as compared to the as-grown GaN-on-Si film. Furthermore, a large increase in the Raman scattering intensity was observed from the nanodisk structures. This enhancement is likely due to more efficient coupling and multiple scattering of light enabled by the large dielectric contrast of the air gap beneath the GaN surface. Such small diameter nanodisk structures would be useful in various applications, such as for GaN based resonant cavity devices as well as low-power nanolasers.

EXAMPLE 4

The use of a simple phosphoric acid (PA) etch of GaN-on-Si pillars before HVPE overgrowth is demonstrated to drastically alter the shells morphology, producing GaN shells with non-polar $\{1\bar{1}00\}$ sidewalls. X-ray diffraction (XRD), room-temperature photoluminescence (PL), cathodoluminescence (CL), and Raman spectroscopy measurements conducted on the core-shell structures indicate significant improvement in the crystal quality and optical properties, as well as reduction of strain in the overgrown structures as compared to the initial epitaxial GaN film on Si substrate.

Fabrication:

Si-doped 0.8 µm thick GaN (0001) films were grown in a commercial MOVPE reactor on n+-Si (111) substrates with approximately 150 nm thick $Al_{1-x}Ga_xN$ buffer layers. To form an etch mask, a 30 nm thick $SiN_x$ film was deposited using plasma-enhanced chemical vapor deposition followed by e-beam deposition of a Ti/Ni (50 nm/120 nm) bi-layer. The 500 µm×500 µm arrays of circles with the diameters of 1 µm, 1.5 µm, and 2 µm and pitches between the circles from 8 µm to 18 µm were fabricated using deep UV lithography and metal lift-off.

The patterns were etched in an ICP system using a $Cl_2/N_2$/Ar gas mixture at 40° C. and 5 mTorr for 5 min. As a result, arrays of GaN-on-Si pillars shaped as truncated cones with approximately 0.8 µm GaN on top of approximately 0.6 µm Si were obtained. After the ICP etch, the metal mask was etched in a $HF:HNO_3:H_2O$ (1:1:10 by volume) solution followed by reactive ion etching (RIE) to remove the $SiN_x$ layer. Some samples received an additional chemical etch in diluted phosphoric acid (85 wt. % $H_3PO_4$: $H_2O$, 1:1) at 130° C. for 2 min. Finally, all samples were cleaned using the Radio Corporation of America (RCA) protocol and dipped in diluted HF (1:10 by volume) for 30 seconds followed by rinsing in deionized water and drying in flowing nitrogen gas immediately before loading in the HVPE reactor.

Undoped GaN shells were epitaxially grown over the etched GaN pillars in a custom-built horizontal HVPE reactor. All overgrowth experiments were performed at 450 Torr reactor pressure and either 950° C. or 1000° C. The $GaCl_x$ volatile precursor was formed by passing 10 sccm to 20 sccm (standard cubic centimeters per minute) of HCl over a boat with molten Ga at 700° C. Ammonia at 20 sccm-100 sccm was used as the group V precursor and nitrogen (5000 sccm) was the carrier gas. Before the growth, substrates were annealed at the growth temperature for 5 min in a $NH_3/N_2$ flow.

Results and Discussion:

Fabricated samples were examined using a scanning electron microscope (SEM). A Rigaku Smart Lab 9 kW high-resolution x-ray diffractometer was used to evaluate crystalline quality of the GaN using rocking curve measurements. An integrated HORIBA Jobin Yvon's LabRAM 800HR bench-top system was used for PL (Kimmon He—Cd, 325 nm) and Raman spectroscopy (Laser Quantum DPSS, 532 nm) measurements, respectively. XRD, PL, and Raman spectra were collected from the whole array of pillars. Local CL spectra were obtained using a Czerny-Turner spectrometer with a CCD camera, where the photons were collected by a diamond-turned parabolic mirror and dispersed with a grating with a groove spacing of 150 lines/mm. All CL measurements were performed with a beam acceleration voltage of 5 kV at room temperature.

Figure 27:
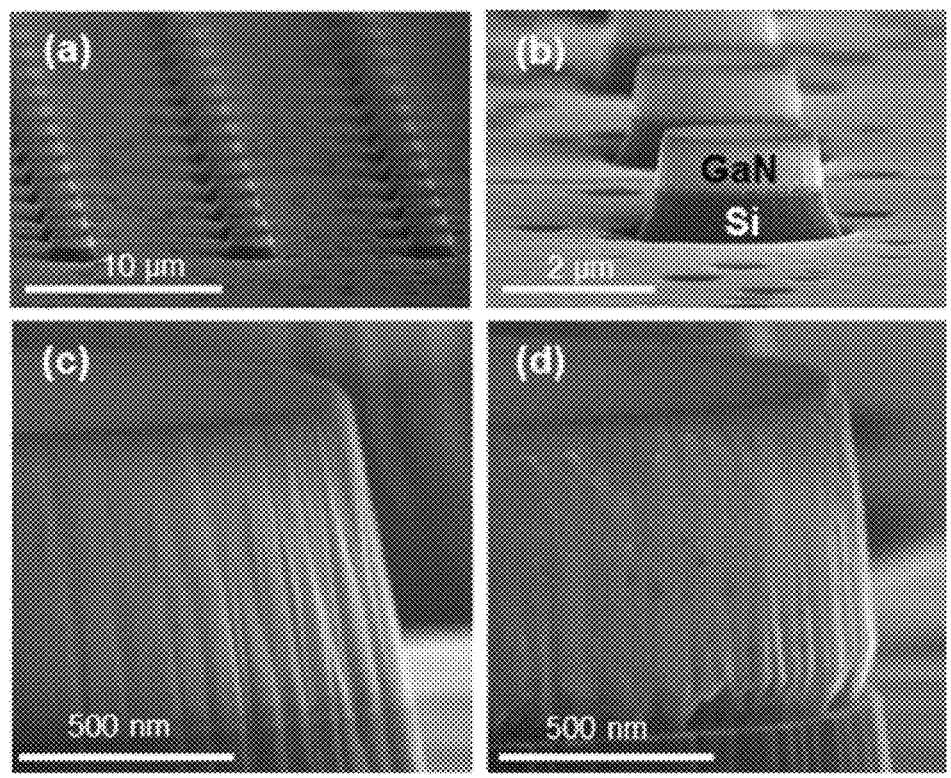
FIG. 27 are SEM images of 2 μm diameter GaN/Si pillars (panels (a) and (b)), and enlarged views (panels (c) and (d)) of the pillar sidewalls after ICP etch (panel (c)) and additional phosphoric acid etch (panel (d)). Note microfaceting and reduced undulations in panel (d) compared to panel (c).

FIG. 27, panels (a), (b) and (c), show GaN-on-Si pillars produced by ICP etching (referred to as ICP-etched pillars). Tapered morphology and wavy sidewalls of the pillars were produced. GaN pillars additionally etched in hot phosphoric acid (referred to as PA-etched pillars) exhibited partially alleviated plasma induced damage to the sidewalls, evident in reduced undulations and the appearance of micro-steps and micro-facets (FIG. 27, panel (d)). PA-etching in accordance with disclosed embodiments did not produce defect-related etch pits on the top c-plane of the pillars, as previously reported for higher etching temperatures (Zhuang, D. & Edgar, J. H. (2005) "Wet Etching of GaN, AlN, and SiC: A Review," Mater. Sci. Eng. R 48:1-46). Faster etching of the AlGaN buffer layer may indicate poor crystalline quality (FIG. 27, panel (d); see Chen, L. et al. (2008) "Inductively Coupled Plasma Etching of AlGaN Using Cl2/Ar/BCl3 Gases," Proc. SPIE 6621:66211A). It may also be related to the fact that AlN can be etched in phosphoric acid more efficiently than GaN (see Ide, T. et al. (2001) "Advantages of AlN/GaN Metal Insulator Semiconductor Field Effect Transistor Using Wet Chemical Etching with Hot Phosphoric Acid," Jpn. J. Appl. Phys., Part 1 40:4785).

Figure 28:
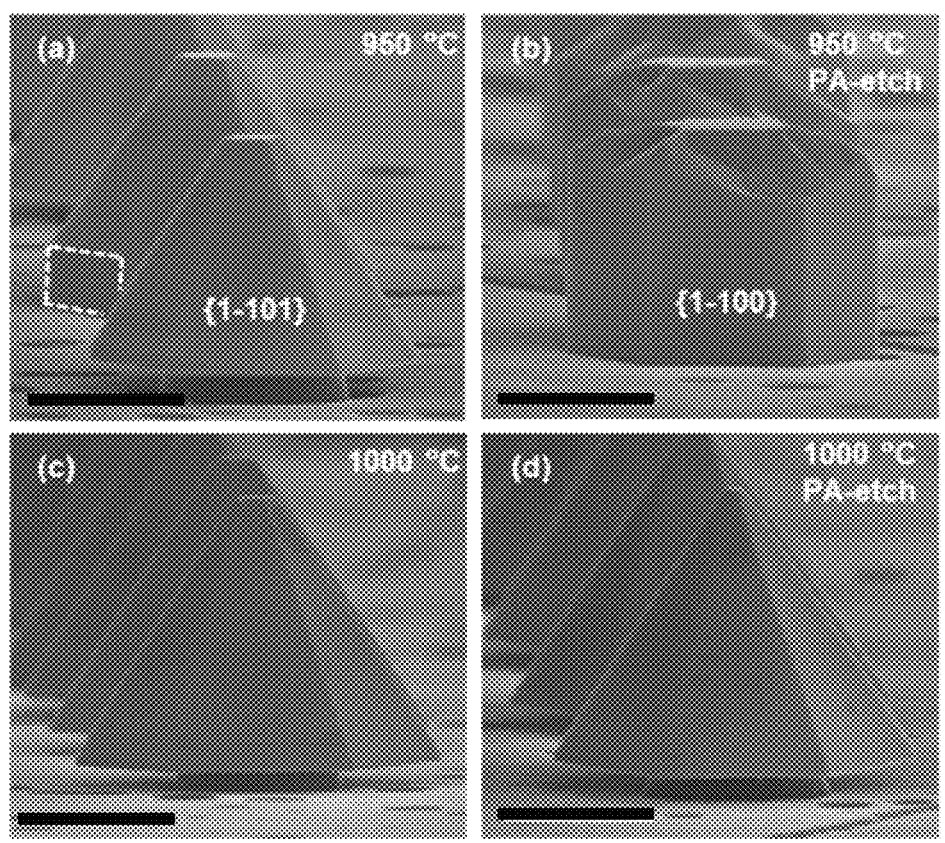
FIG. 28 are SEM images of GaN shells grown on 2 μm diameter GaN/Si pillars for 2 minutes at 950° C. (panels (a) and (b)) and at 1000° C. (panels (c) and (d)). Pillars shown in panels (a) and (c) were ICP-etched only; those shown in panels (b) and (d) were additionally etched in hot PA. The dashed line box area in panel (a) highlights one of the wide {1$\bar{1}$00} facets observed on some pyramids. Scale bars correspond to 2 μm.

HVPE grown shells on ICP- and PA-etched pillars at 950° C. using 20 sccm HCl and 100 sccm $NH_3$ were compared (FIG. 28, panels (a) and (b)). Overgrowth of the ICP-etched pillars produced truncated hexagonal pyramids with semipolar $\{1\bar{1}01\}$ side facets. This morphology is typical for SAE growth by metalorganic chemical vapor deposition (Liu, H.-P. et al. (2004) "The Growth Mechanism of GaN Grown by Hydride Vapor Phase Epitaxy in $N_2$ and $H_2$ Carrier Gas," J. Cryst. Growth 260:79; Lundskog, A. et al. (2012) "Morphology Control of Hot-Wall MOCVD Selective Area Grown Hexagoal GaN Pyramids," Cryst. Growth Des. 12:5491-5496; Krylyuk, S. et al. (2012) "Large-area GaN n-core/p-shell Arrays Fabricated Using Top-down Etching and Selective Epitxial Overgrowth," Appl. Phys. Lett. 101: 241119). The pyramids also exhibited non-polar $\{1\bar{1}00\}$ facets at the base with randomly varying width across the array. For some pyramids, non-polar $\{1\bar{1}00\}$ m-plane facets extend down to the silicon substrate (FIG. 28, panel (a), broken line boxed area).

In contrast, HVPE overgrowth of PA-etched GaN pillars produced strikingly different shells with the morphology of hexagonal pyramids with vertical $\{1\bar{1}00\}$ sidewalls and wider (0001) top facet truncated by high-index vicinal facets (FIG. 28, panel (b)). In addition, all shells appeared to be in contact with the Si substrate. Their height is similar to that of the shells with inclined sidewalls grown over ICP-etched pillars, which indicates the same, 850 nm/min, upward growth rate in the [0001] direction over both ICP- and PA-etched pillars. For comparison, the lateral growth rate in the [$1\bar{1}00$] direction of the shells shown in FIG. 28, panel (b), is about 400 nm/min.

Figure 29:
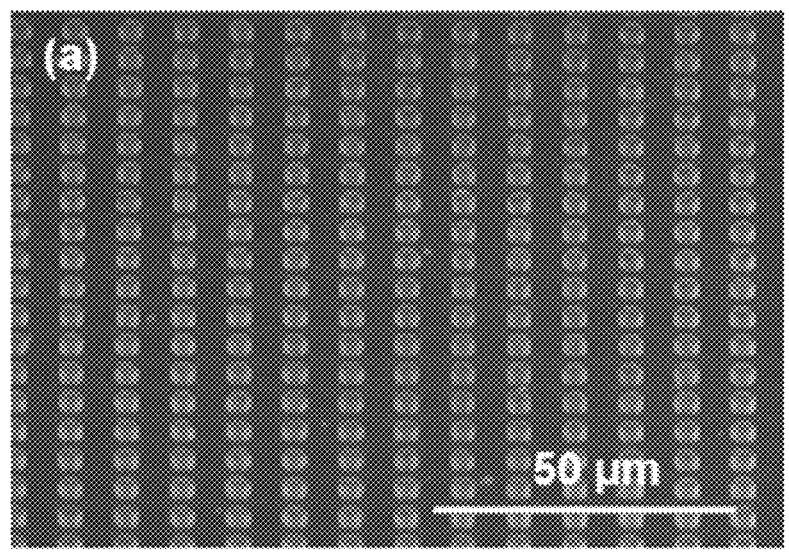
FIG. 29 are tilted SEM images of GaN shells grown on PA-etched GaN/Si pillars at 950° C. for 2 minutes (panels (a) and (b)).
Figure 29:
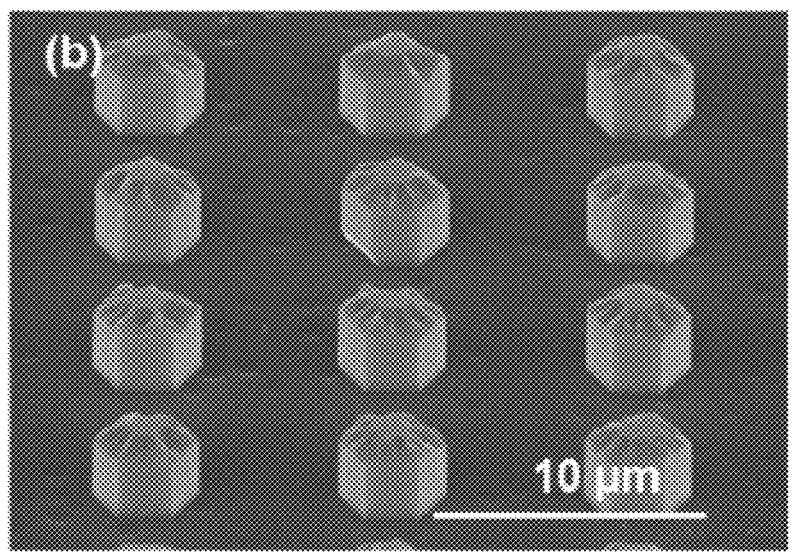

Low-magnification SEM images (FIG. 29, panels (a) and (b)) illustrate the uniformity of the obtained core/shell structures across the array. Use of low V/III ratio is found to be effective for preventing spontaneous nucleation of GaN on the Si substrate, while low growth temperatures along with RCA cleaning and $NH_3$ annealing of the substrates prior to the HVPE growth have substantially eliminated parasitic reactions between Si and Ga, known as "melt-back etching" (Kaneko, Y. et al. (1997) "Melt-back Etching of GaN," Solid-State Electron. 41:295-298). For the employed growth conditions, however, the impact of the PA-etching disappeared at higher growth temperature. FIG. 28, panels (c) and (d), show similar hexagonal pyramids with inclined $\{1\bar{1}01\}$ sidewalls for both ICP- and PA-etched pillars at 1000° C. growth temperature.

Figure 30:
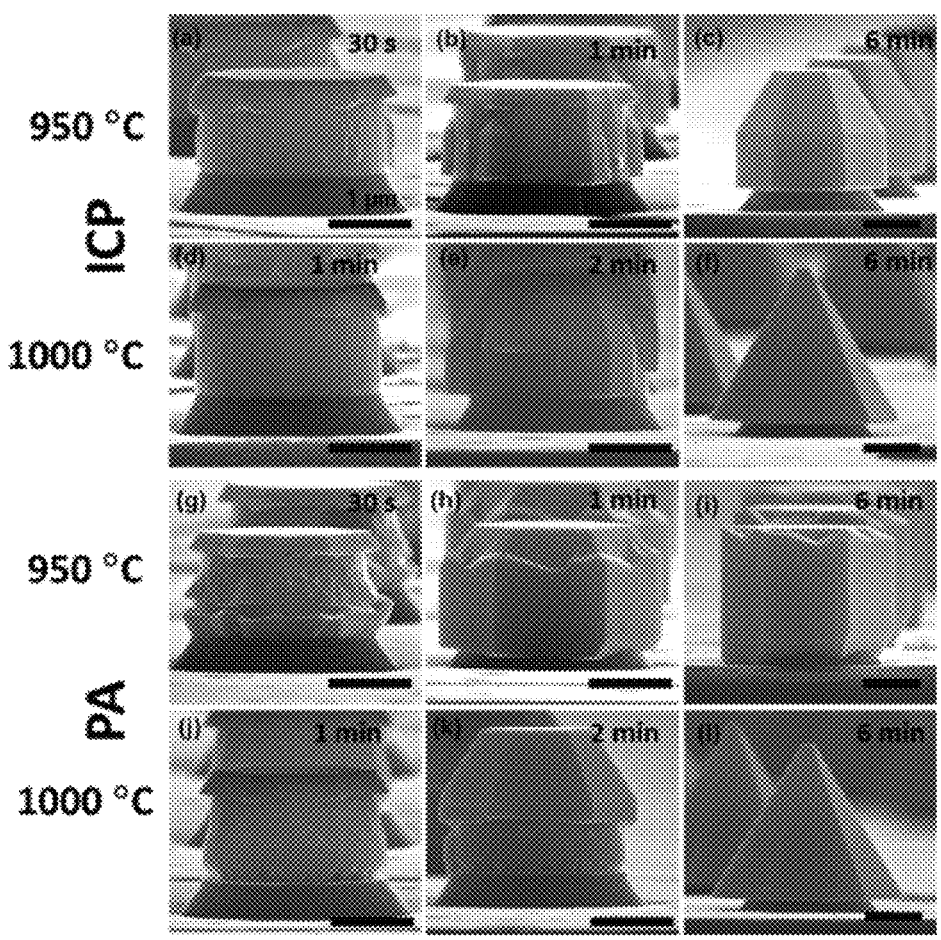
FIG. 30 are SEM images of GaN shells grown for different durations on ICP-etched pillars (panels (a)-(f)) and PA-etched pillars (panels (g)-(l)) at 950° C. and 1000° C. Scale bars correspond to 1 μm.
Figure 31:
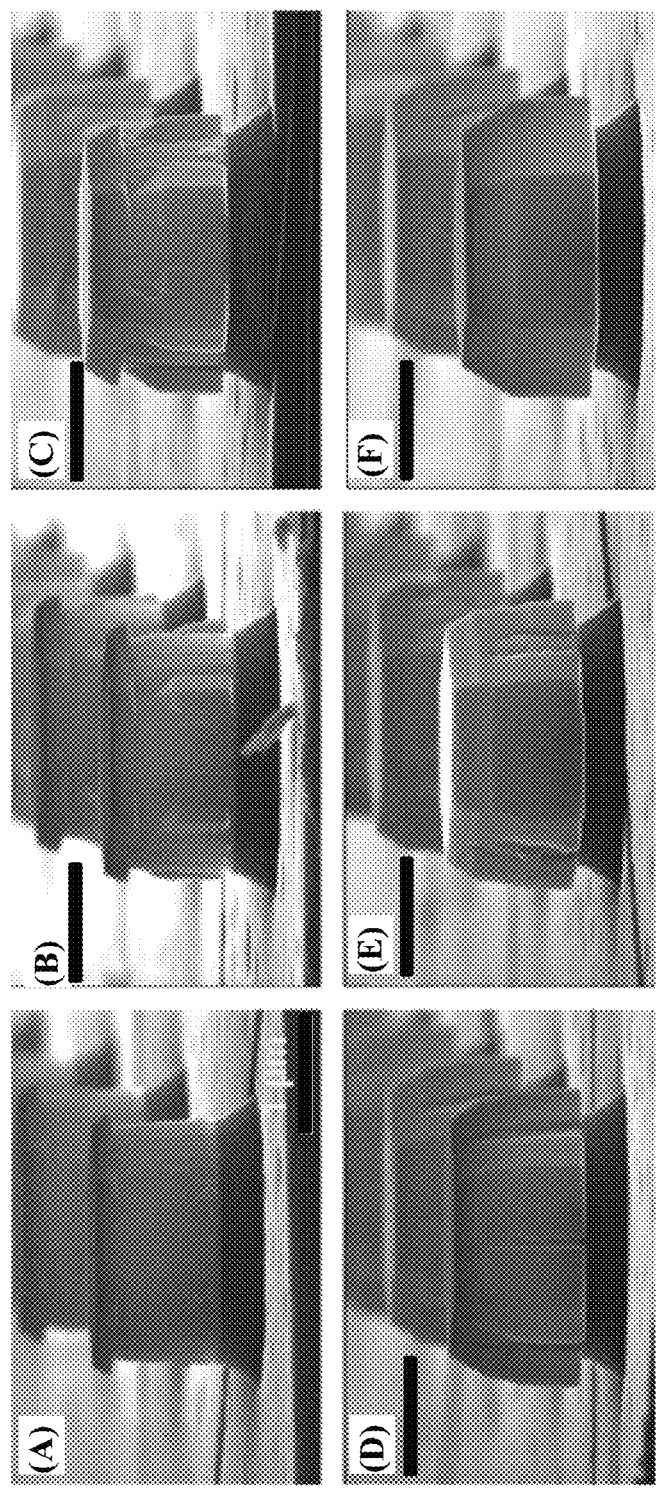
FIG. 31 are SEM images (panels (A)-(F)) showing shell formation on ICP-etched pillars at 950° C. All images were taken on the same sample overgrown for 1 minute. Pillars with incomplete shells are found around the edges of an array where the growth rate is lower. The scale bars correspond to 1 μm.

The surprising ability to control sidewall polarity of the GaN core-shell structures by PA-etching of the GaN pillars is intriguing. In order to reveal mechanisms resulting in different faceting, shells are grown on ICP- and PA-etched pillars for 30 s to 6 min at the same pressure and temperatures as described above but at a lower material deposition rate achieved by lowering HCl and $NH_3$ flows to 10 sccm and 20 sccm, respectively. The results are summarized in FIG. 30. For the ICP-etched pillars, growth starts on the top of the pillars forming (0001) and $\{1\bar{1}01\}$ facets. Besides, GaN nuclei that form on the sidewalls (FIG. 30, panel (a)) eventually evolve into $\{1\bar{1}00\}$ facets as shown in FIG. 30, panels (b) and (e). Complimentary SEM images showing shell formation on ICP-etched pillars are shown in FIG. 31, panels (A), (B), (C), (D), (E), and (F).

Initial stages of the shell growth are similar for the two temperatures. Overgrowth of ICP-etched pillars for 6 min at 950° C. and 1000° C. yielded different shell morphologies (FIG. 30, panels (c) and (f)). The shells grown at 950° C. exhibit well defined (0001) and $\{1\bar{1}00\}$ facets in addition to inclined $\{1\bar{1}01\}$ facets which dominate at higher $GaCl_x/NH_3$ flows, as shown in FIG. 28, panel (a). The pyramidal shells with $\{1\bar{1}01\}$ sidewalls were obtained at 1000° C., which resemble those shown in FIG. 28, panel (c).

Figure 32:
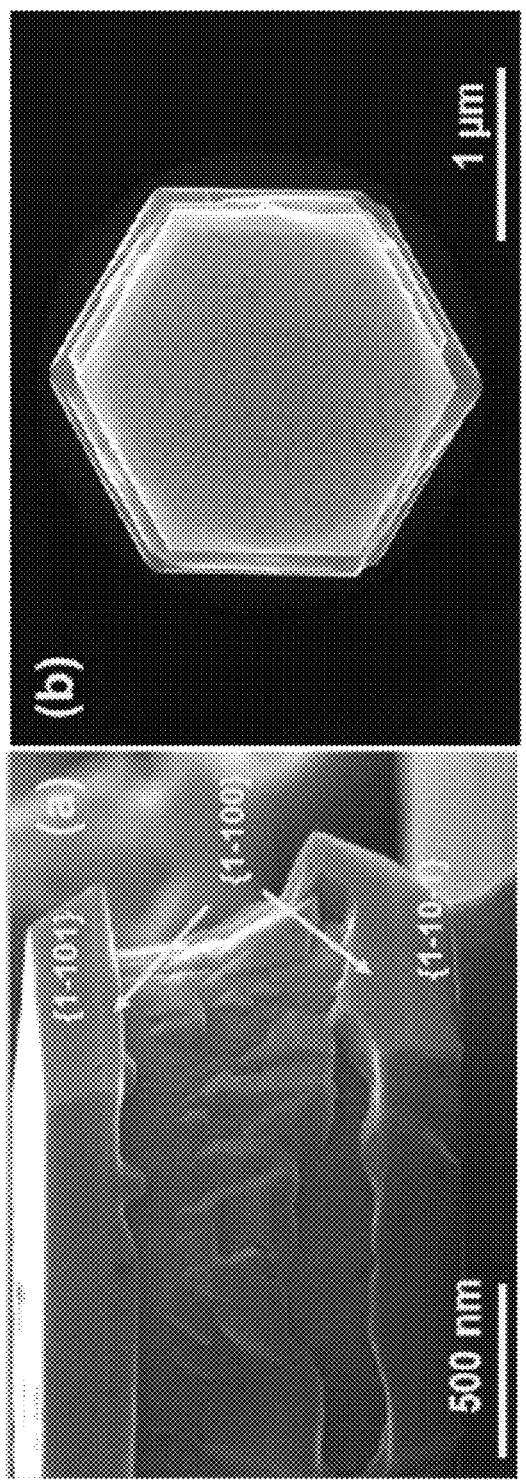
FIG. 32 are side and top views (panels (a) and (b), respectively) of GaN shells grown on PA-etched pillars at 950° C. for 30 seconds.

The initial stage of the shell growth on PA-etched pillars at 950° C. is depicted in FIG. 30, panel (g). An enlarged view is shown in FIG. 32. It is evident that the undercut at the Si—GaN interface created by faster etching of the AlGaN buffer layer provides an additional site for the GaN shell nucleation. Thus, two growth fronts that appear on the top and at the bottom of each pillar start moving toward each other. The facets formed by growth on the top of the pillars are (0001), $\{1\bar{1}01\}$, and $\{1\bar{1}00\}$, whereas the shell emerging from the bottom is bounded by $\{1\bar{1}00\}$ and $\{1\bar{1}0\bar{1}\}$ planes. When the two growth fronts eventually merge, they define the shell morphology shown in FIG. 30, panels (h) and (i). Notably, increasing the growth temperature eliminates nucleation at the bottom, in the vicinity of the AlGaN buffer. As a result, the shell growth proceeds similarly to the ICP-etched pillars (FIG. 30, panels (j), (k) and (l)).

Figure 33:
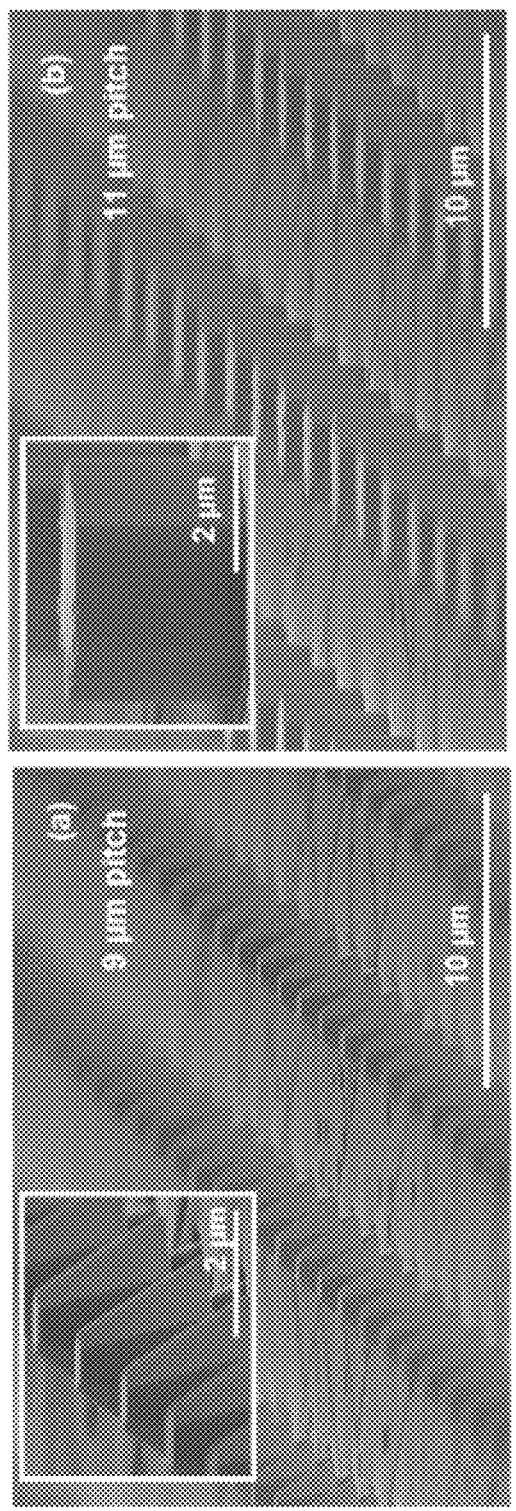
FIG. 33 are SEM images showing GaN shells with semipolar sidewalls (panel (a)) and nonpolar sidewalls (panel (b)) grown on adjacent arrays of PA-etched pillars with different pitch as indicated. $T_{growth}=950°$ C.

Despite the large difference in surface energies of $\{1\bar{1}01\}$ and $\{1\bar{1}00\}$ planes (dangling bond densities are 16.0 $nm^{-2}$ and 12.1 $nm^{-2}$, respectively), they often co-exist for GaN columns produced in MOVPE as well as HVPE and SAE experiments (Fichtenbaum, N. A. et al. (2007), supra, Jpn. J. Appl. Phys., Part 2 46:L230; Le Boulbar, E. D. et al. (2013) "Facet Recovery and Light Emission from GaN/InGaB/GaB core-shell Structures Grown by Metal Organic Vapour Phase Epitaxy on Etched GaN Nanorod arrays," Appl. Phys. 114:094302; Liu, H.-P. et al. (2004) "The Growth Mechanism of GaN Grown by Hydride Vapor Phase Epitaxy in $N_2$ and $H_2$ Carrier Gas," J. Cryst. Growth 260:79; Lundskog, A. et al. (2012) "Morphology Control of Hot-Wall MOCVD Selective Area Grown Hexagonal GaN Pyramids," Cryst. Growth Des. 12:5491-5496). This indicates that their growth is controlled by surface reaction kinetics. Thus, variations in the growth environment can increase the relative deposition rate on one particular type of the facets, resulting in their disappearance, in accordance with the kinetic Wulff theory (Du, D. et al. (2005) "Systematic Prediction of Kinetically Limited Crystal Growth Morphologies," Phys. Rev. Lett. 95:155503). As demonstrated herein, the resulting GaN shell morphology is very sensitive to the local growth conditions, as exemplified in FIG. 33 showing shells with semipolar and non-polar sidewalls obtained on adjacent arrays of PA-etched GaN pillars with different pitches.

Figure 34:
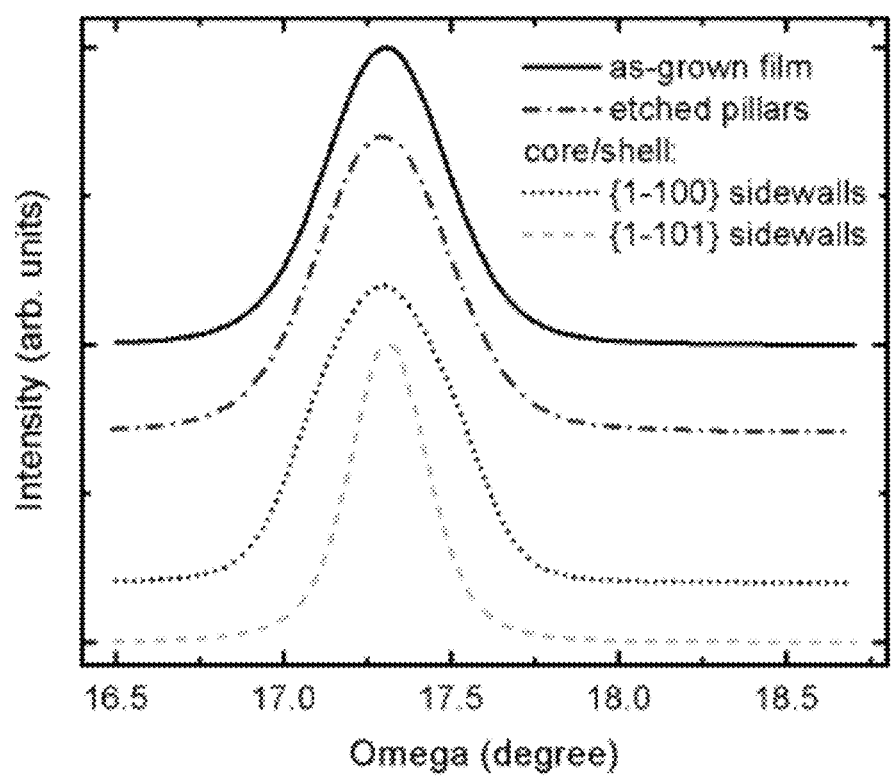
FIG. 34 shows a comparison of X-ray rocking curves (0002) for epilayer film, ICP-etched pillars, and overgrown shells with semi-polar {1T01} and non-polar {1T00} sidewalls

Structural and optical properties of individual core-shell pillars and their arrays are characterized using XRD, PL, Raman, and CL measurements. Data is presented for the structures shown in FIG. 28, panels (a) and (b). FIG. 34 compares the X-ray rocking curves of the (0002) reflection measured on the as-grown GaN epilayer, the ICP etched pillars, and after the shell overgrowth with semi-polar and non-polar sidewalls. The full-width at half maximum (FWHM) values of the (0002) peak along with the peak intensity of all four samples are summarized in Table 1:

TABLE 1

FWHM and peak intensity of (0002) reflection of as-grown GaN-on-Si epilayer, ICP-etched GaN pillars, and core-shell structures semi-polar $\{1\bar{1}01\}$ and non-polar $\{1\bar{1}00\}$ sidewalls.

|  | FWHM (deg) | Peak Intensity (cps) |
|---|---|---|
| As-grown | 0.407 | $1.5 \times 10^7$ |
| Etched pillars | 0.441 | $5 \times 10^4$ |
| Shell, $\{1\bar{1}01\}$ sidewalls | 0.409 | $4.8 \times 10^5$ |
| Shell, $\{1\bar{1}00\}$ sidewalls | 0.264 | $1.0 \times 10^6$ |

The large FWHM values for both thin-film and etched pillars indicate relatively poor GaN crystalline quality. However, a significant reduction of the FWHM value of the overgrown sample that received PA-etch prior to the overgrowth as compared to the other three samples indicated significant improvement in the material quality relative to the starting epilayer. Of note, the FWHM values of the overgrown samples combine contributions from both the poor crystalline quality cores and the dislocation-free shells. Although the reduction of dislocation density in the semi-polar shells has been demonstrated, the dislocation-free region is mostly confined to the upper section of the overgrown shell where the shell thickness is small, whereas the bottom thick part of the shell still contains laterally propagating dislocations (Krylyuk, S. et al. (2012) "Large-area GaN n-core/p-shell Arrays Fabricated Using Top-down Etching and Selective Epitxial Overgrowth," Appl. Phys. Lett. 101:241119; Tanaka, S. et al. (2000) "Defect Structure in Selective Area Growth GaN Pyramid on (111) Si Substrate," Appl. Phys. Lett. 76:2701). In contrast, for non-polar shells, the thickness of the dislocation-free shell region is higher.

Figure 35:
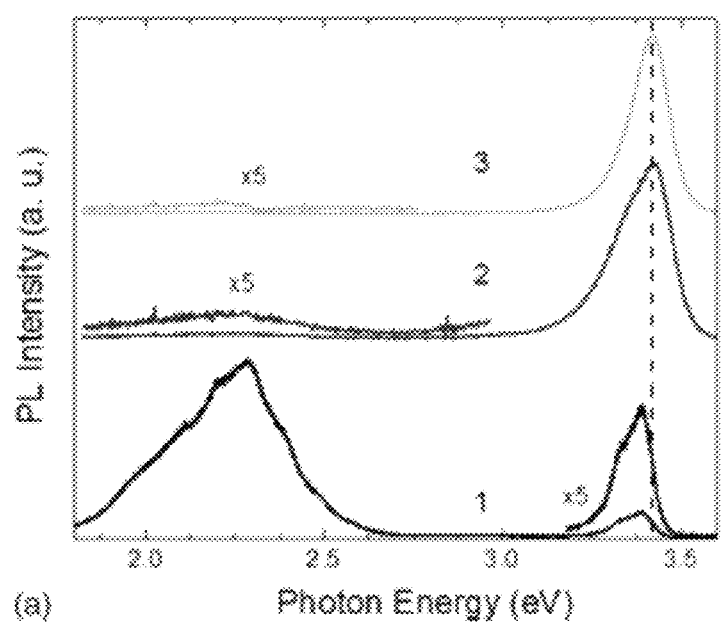
FIG. 35 shows room-temperature PL of (1) ICP-etched pillars and core-shell structures with (2) semipolar and (3) non-polar sidewalls grown at 950° C. The vertical dotted line denotes NBE peak positions measured for bulk HVPE GaN, 3.42 eV and 567.2 cm$^{-1}$, respectively.
Figure 36:
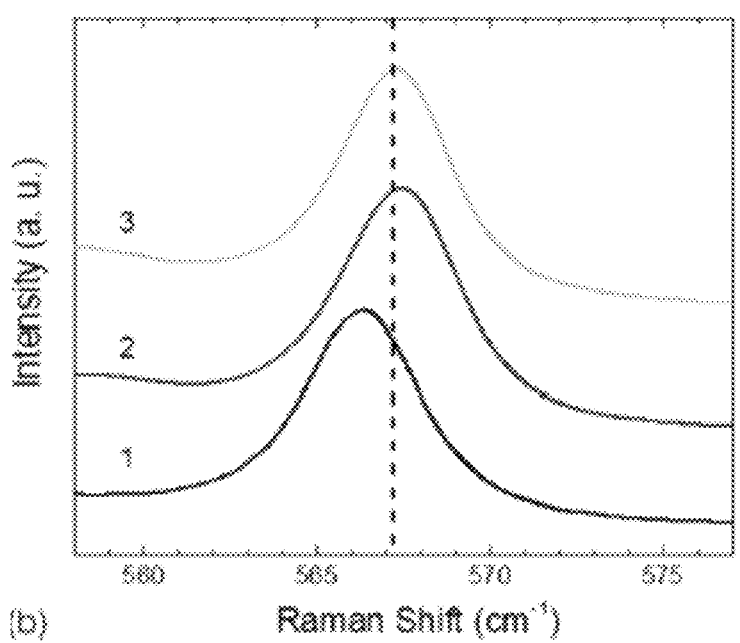
FIG. 36 illustrates graphically room temperature Raman scattering spectra of (1) ICP-etched pillars and core-shell structures with (2) semipolar and (3) non-polar sidewalls grown at 950° C. The vertical dotted lines denote $E_2^H$ peak positions measured for bulk HVPE GaN, 3.42 eV and 567.2 cm$^{-1}$, respectively.

Material quality and the level of strain relaxation of the GaN pillars and core-shell structures at different stages of processing were assessed by room-temperature PL, Raman, and CL spectroscopy. PL spectra of 2 μm diameter GaN pillars (cores) as well as overgrown shells obtained at 950° C. are shown in FIG. 35. Raman scattering spectra of GaN pillars and core-shell structures taken in the vicinity of the $E_2^H$ phonon mode are shown in FIG. 36. The dashed vertical line in FIGS. 35 and 36 denotes the peak energy positions of the near-band edge (NBE) PL and Raman $E_2^H$ phonon mode, respectively, measured for a free-standing 3 mm thick GaN commercial sample grown by HVPE.

Referring to FIG. 35, the significant red-shift of the NBE peak of etched pillars compared to the bulk-like thick GaN is due to in-plane biaxial tensile strain caused by lattice and thermal expansion mismatch between GaN and Si. However, compared to the initial thin film, significant strain-relaxation was observed in the etched pillars. Notably, a broad PL band around 2.2 eV observed in the ICP-etched pillars was significantly reduced after shell overgrowth, particularly for the shells grown on PA-etched pillars. It is well recognized that this band, often referred to as yellow luminescence (YL), is caused by defects and/or impurities (Reshchikov, M. A. & Morkoc, H. (2005) "Fabrication and Evaluation of GaN Negative and Bifocal Microlenses," J. Appl. Phys. 97:061301; Demchenko, D. O. et al. (2013) "Yellow Luminescence of Gallium Nitride Generated by Carbon Defect Complexes," Phys. Rev. Lett. 110:087404). Decreasing the YL intensity with respect to the NBE emission indicates a superior quality of the overgrown GaN shells as compared to the initial material. In general, despite the difference in morphology, core-shell structures with semi-polar and non-polar sidewalls exhibit very similar optical properties that are also similar to those of the shells grown at 1000° C.

Referring to FIG. 36, partial strain relaxation is observed in all ICP-etched pillars as compared to the thin film (not shown), which is consistent with the PL data (Debnath, R. et al. (2014), "Top-down Fabrication of Large-area GaN Micro- and Nanonpillars," J. Vac. Sci. Technol. B 32:021204). After the GaN shell growth, further strain relaxation is evident from the shifting of the $E_2^H$ peak toward the bulk value. Thus, the overgrowth produces essentially strain-free material of high optical quality.

Figure 37:
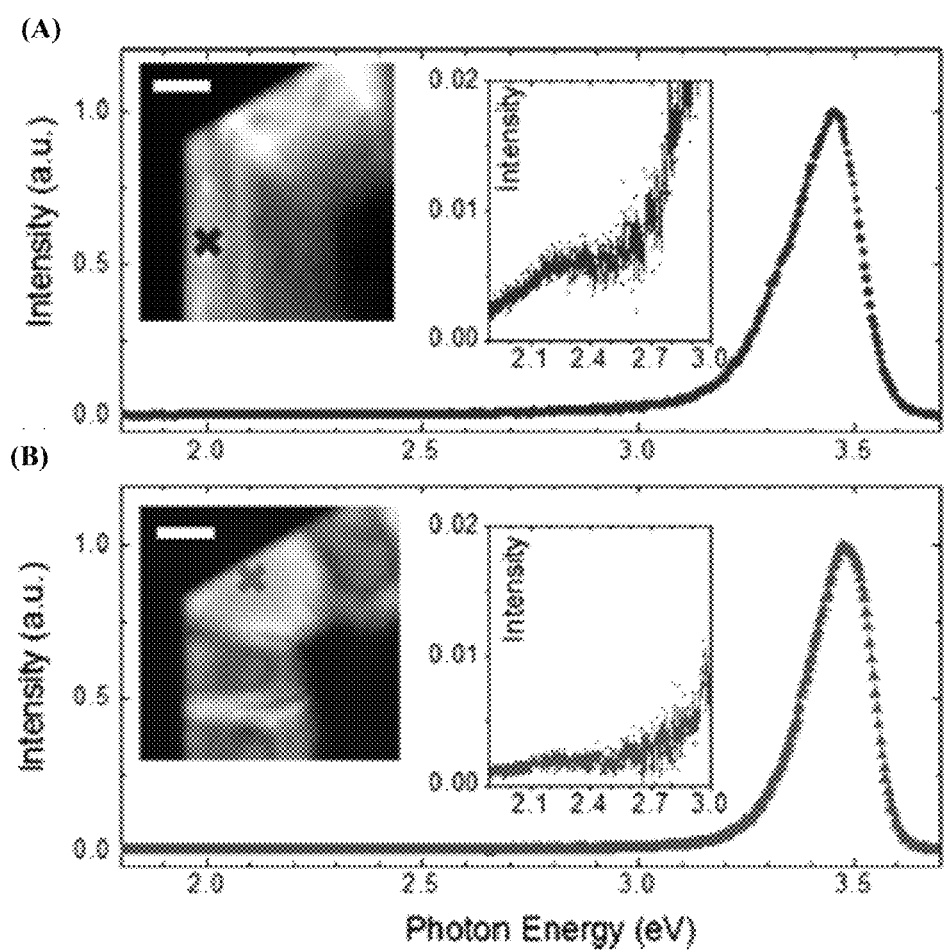
FIG. 37 shows CL spectra of the GaN shells grown at 950° C. on ICP-etched pillars (panel (a)) and PA-etched pillars (panel (b)). Positions of the irradiating electron beam are marked in the corresponding panchromatic CL images in the left insets of panels (a) and (b). YL bands are enhanced in the right insets of panels (a) and (b). Scale bars correspond to 500 nm.

FIG. 37, panels (A) and (B), shows local CL spectra obtained on individual GaN shells. Use of an electron acceleration voltage of 5 kV (penetration depth is approximately 160 nm) ensures that only the overgrown GaN is probed. The CL data are in agreement with the PL spectra collected over the large sampling areas. The primary CL peak around 3.46 eV is assigned to NBE emission while the YL is very weak. The NBE peak intensity of the PA-etched sample was found to be 3- to 5-fold higher than that of the ICP-etched sample. The NBE peak of the PA-etched sample is narrower than that of the ICP-etched sample in the normalized CL spectra in FIG. 37, which is in agreement with PL data.

Concluding, large-area arrays of vertically aligned GaN core-shell structures are fabricated using selective epitaxial overgrowth of GaN pillars obtained by top-down etching of GaIIon-Si epilayers. The facets of GaN shells may be switched from $\{1\bar{1}01\}$ semi-polar to $\{1\bar{1}00\}$ non-polar planes by employing a hot phosphoric acid etching of GaN pillars prior to the overgrowth by HVPE and tuning the growth temperature. XRD reveals improved crystal quality of the overgrown shells as compared to the initial GaN cores. Room-temperature PL and CL spectra exhibit significant enhancement of the NBE peak in core-shell structures as compared to both the starting epilayer and etched cores with significant reduction in yellow luminescence.

In addition, significant in-plane strain relaxation is observed after the shell overgrowth. The results demonstrate the effectiveness of combining the scalability and reproducibility of top-down etching techniques with high material quality achievable using selective homoepitaxial overgrowth to form GaN core-shell structures. Such structures have the potential to be utilized in numerous applications, such as large-area photodetectors, emitters, and photovoltaic devices.

All publications mentioned in this specification are herein incorporated by reference to the same extent as if each individual publication was specifically and individually indicated to be incorporated by reference in its entirety. While the invention has been described in connection with exemplary embodiments thereof, it will be understood that it is capable of further modifications and this application is intended to cover any variations, uses, or adaptations of the invention following, in general, the principles of the invention and including such departures from the present disclosure as come within known or customary practice within the art to which the invention pertains and as may be applied to the features hereinbefore set forth.

What is claimed is:

1. A method of fabricating an array of microstructures, comprising the steps of:
    providing an epilayer of gallium nitride (GaN) grown on a substrate;
    etching an array of GaN pillars in said epilayer; and
    growing GaN shells on said etched array of GaN pillars to form core-shell structures via selective epitaxy, wherein a first portion of said GaN shells are doped with a first material, and a second portion of said GaN shells are doped with a second material different than said first material.

2. The method of claim 1, wherein said substrate comprises a material selected from the group consisting of sapphire, silicon, gallium arsenide, and silicon carbide.

3. The method of claim 1, wherein said substrate further comprises a buffer layer intermediate a base layer and said GaN epilayer.

4. The method of claim 3, wherein said buffer layer comprises at least one of aluminum nitride (AlN) and aluminum gallium nitride (AlGaN).

5. The method of claim 1, wherein a least a portion of said GaN pillars are doped with silicon, magnesium, zinc, or iron.

6. The method of claim 1, wherein at least a portion of said GaN shells are doped with silicon, magnesium, zinc, or iron.

7. The method of claim 1, wherein said first portion of said GaN shells have a first chemical composition, and said second portion of said GaN shells have a second chemical composition different than said first chemical composition.

8. The method of claim 7, wherein said first and second portions of said GaN shells are sequentially grown on said etched array of GaN pillars.

9. The method of claim 1, wherein said etching step comprises inductively coupled plasma (ICP) etching.

10. The method of claim 9, comprising the further step of chemically etching said ICP etched array of pillars.

11. The method of claim 10, wherein said chemically etching step comprises hot phosphoric acid etching.

12. The method of claim 10, wherein said chemically etching step comprises etching in a solution comprising potassium hydroxide (KOH).

13. The method of claim 1, wherein said selective epitaxy is hydride vapor phase epitaxy (HVPE).

14. The method of claim 13, wherein said HVPE utilizes at least one of ammonia, nitrogen, or hydrogen chloride gas.

15. The method of claim 13, wherein said HVPE is conducted at a temperature of between about 850° C. and about 1150° C.

16. The method of claim 13, wherein said HVPE is conducted at a pressure between about 10 Torr and about 760 Torr.

17. The method of claim 1, wherein said core-shell structures have inclined {1-101} sidewalls.

18. The method of claim 1, wherein said core-shell structures have vertical {1-100} sidewalls.

* * * * *